United States Patent [19]

Takeuchi

[11] Patent Number: 5,664,927

[45] Date of Patent: Sep. 9, 1997

[54] SUBSTRATE PROCESSING METHOD AND APPARATUS

[75] Inventor: Mitsuo Takeuchi, Kawasaki, Japan

[73] Assignee: Fujitsu Limited, Kanagawa, Japan

[21] Appl. No.: 385,450

[22] Filed: Feb. 8, 1995

[30] Foreign Application Priority Data

Feb. 10, 1994 [JP] Japan .................. 6-016737

[51] Int. Cl.$^6$ .................. H01L 21/304
[52] U.S. Cl. .................. 414/225; 414/940; 414/937
[58] Field of Search .................. 414/222, 937, 414/938, 940, 225, 226, 936, 941, 939; 134/902

[56] References Cited

U.S. PATENT DOCUMENTS

| | | | |
|---|---|---|---|
| 4,682,614 | 7/1987 | Silvernail et al. | 134/902 |
| 4,840,530 | 6/1989 | Nguyen | 414/940 |
| 4,952,115 | 8/1990 | Ohkase | 414/416 |
| 4,974,619 | 12/1990 | Yu | 414/226 |
| 5,299,901 | 4/1994 | Takayama | 414/938 |
| 5,383,484 | 1/1995 | Thomas et al. | 434/902 |
| 5,452,801 | 9/1995 | Horn | 414/940 |

FOREIGN PATENT DOCUMENTS

| | | |
|---|---|---|
| 4-49619 | 2/1992 | Japan . |
| 5-36668 | 2/1993 | Japan . |

*Primary Examiner*—Karen B. Merritt
*Assistant Examiner*—Gregory A. Morse
*Attorney, Agent, or Firm*—Nikaido, Marmelstein, Murray & Oram LLP

[57] ABSTRACT

A substrate processing method includes the steps of accommodating a plurality of substrates within a carrier, where the carrier has a bottom that is open and has a function of stopping inclination of the substrates, transporting the substrates and the carrier to a processing chamber by a transport mechanism having a function of supporting weights of the substrates, and carrying out a process on the substrates within the processing chamber.

20 Claims, 20 Drawing Sheets

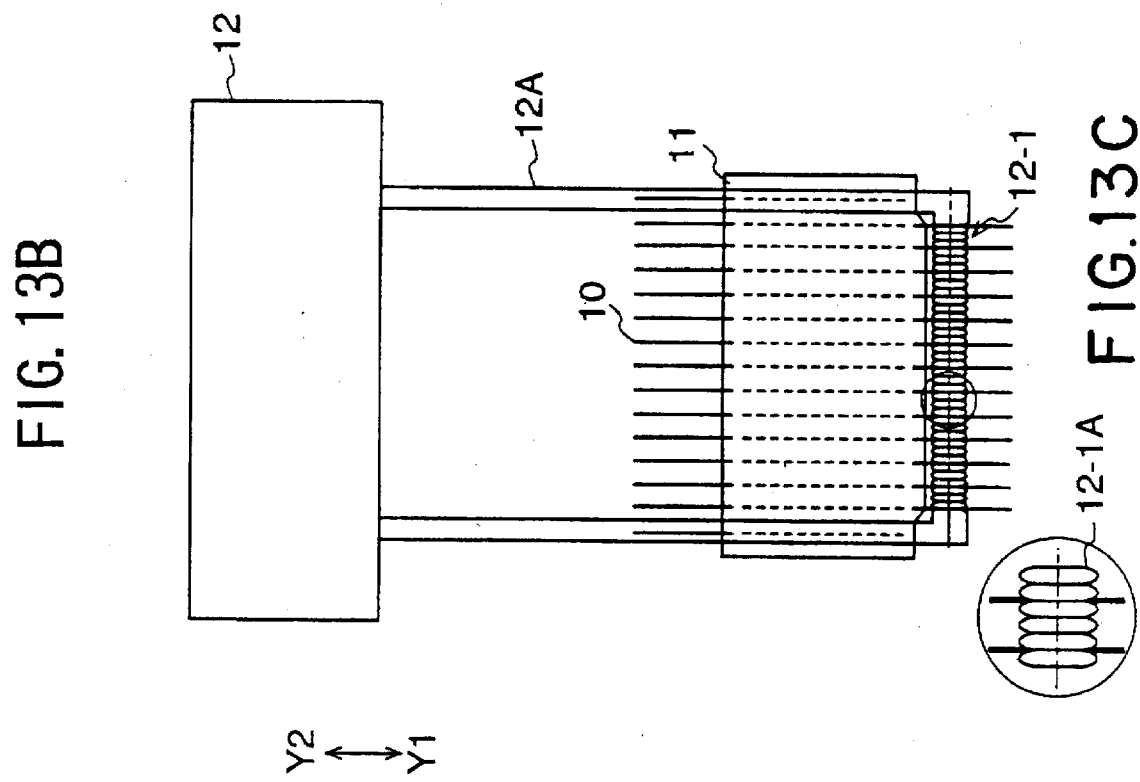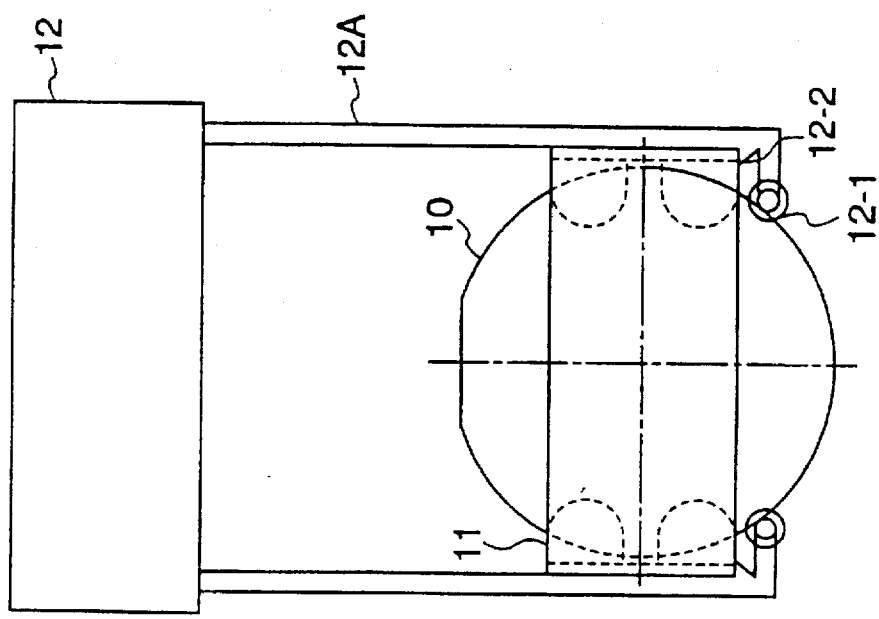

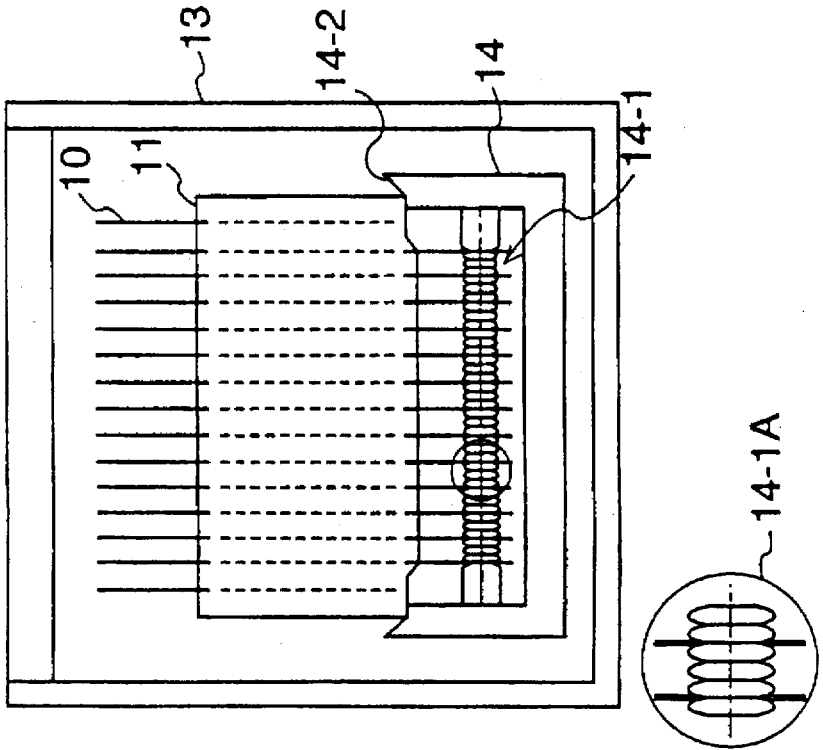
FIG. 14B
FIG. 14C
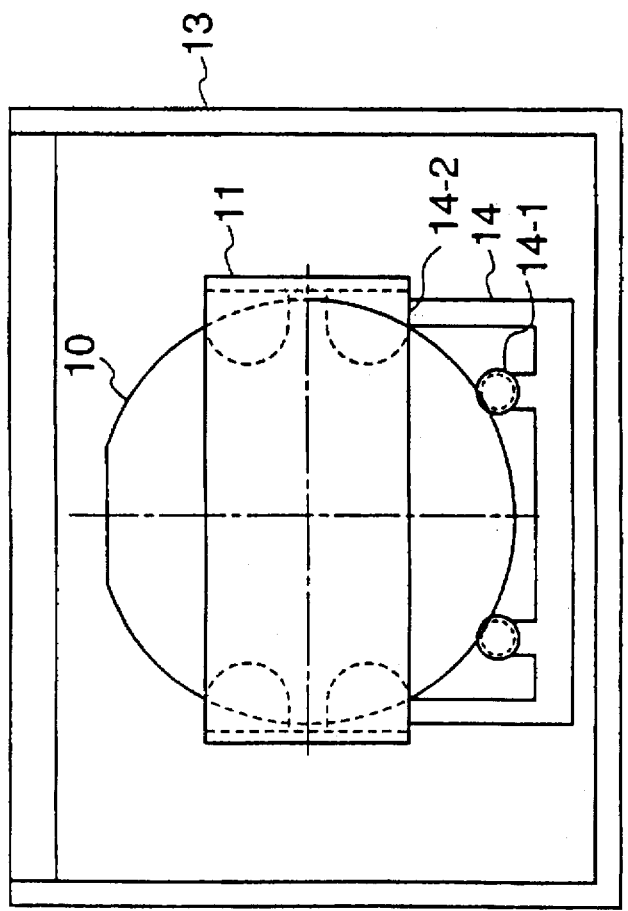
FIG. 14A

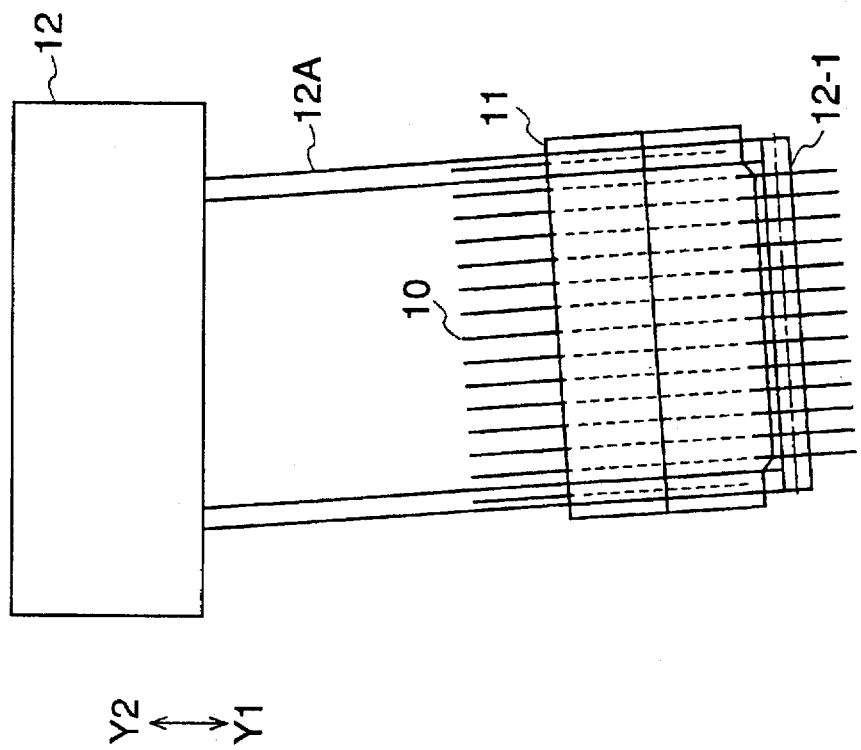
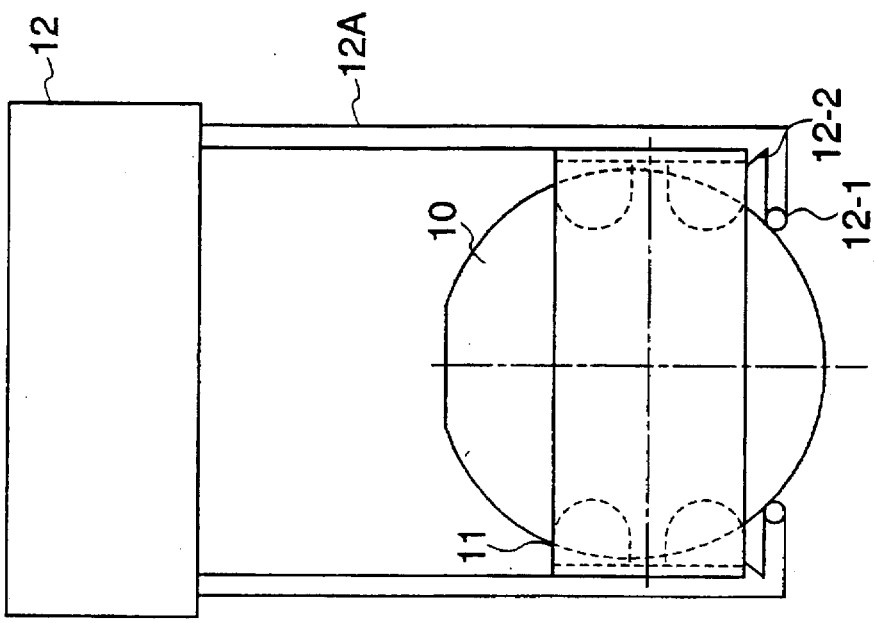

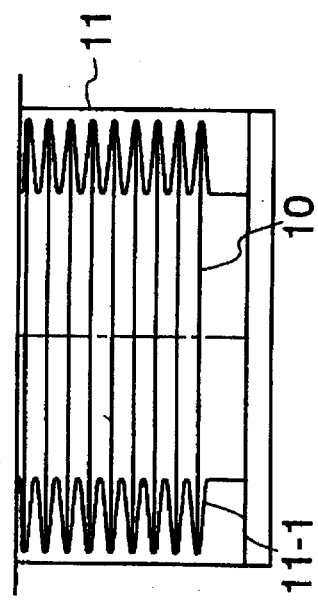
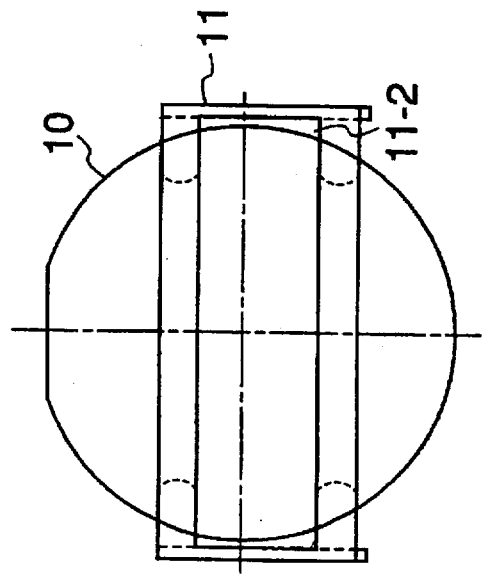
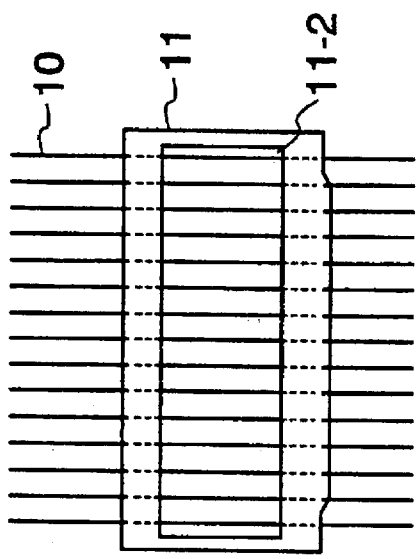

SUBSTRATE PROCESSING METHOD AND APPARATUS

BACKGROUND OF THE INVENTION

The present invention generally relates to substrate processing methods and apparatuses, and more particularly to a substrate processing method which carries out a process on a plurality of substrates simultaneously by carrying the substrate to a processing chamber, and to a substrate processing apparatus that employs such a substrate processing method.

When manufacturing semiconductor devices, a wafer that is used as a substrate is subjected to a cleaning process or the like by a chemical substrate surface preparation apparatus. A so-called batch type chemical substrate surface preparation apparatus is normally used because a plurality of wafers are cleaned simultaneously. But as the diameter of the wafer becomes larger, the chemical preparation chamber becomes larger, thereby increasing the size of the chemical substrate surface preparation apparatus itself. The size of other substrate processing apparatuses that carry out a predetermined process, other than the cleaning process, with respect to a plurality of substrates simultaneously, is similarly increasing.

FIGS. 1A and 1B show a first example of a conventional substrate processing apparatus. FIG. 1A is a front view showing the first conventional substrate processing apparatus in a state where wafers have been transported to a chemical chamber, and FIG. 1B is a front view showing the first conventional substrate processing apparatus in a state where the wafers are transported to the chemical chamber or are transported outside the chemical chamber. For the sake of convenience, it will be assumed that the first conventional substrate processing apparatus is a chemical substrate surface preparation apparatus for cleaning the wafers.

According to the first conventional substrate processing apparatus, a plurality of wafers 500 are accommodated within a cleaning carrier 501 and transported. A transport robot 502 holds the cleaning carrier 501 by arms 502A as shown in FIG. 1B, and moves in a direction Y1 so as to transport the cleaning carrier 501 into a chemical chamber 503 together with the accommodated wafers 500. Thereafter, the arms 502A open in directions of arrows as indicated by a dotted line in FIG. 1A, so that the cleaning carrier 501 is placed on a carrier support 504 within the chemical chamber 503. After cleaning the wafers 500, the arms 502A close from the open position indicated by the dotted line in FIG. 1A to the closed position indicated by the solid line and hold the cleaning carrier 501. The cleaning carrier 501 held by the arms 502A is moved in a direction Y2 in FIG. 1B, and the cleaning carrier 501 is transported outside the chemical chamber 503 together with the wafers 500.

As the diameter of the wafers 500 increases, the size of the cleaning carrier 501 itself increases, thereby increasing the size of the first conventional substrate processing apparatus.

On the other hand, the cleaning carrier 501 must be made of a material that does not interfere with the cleaning process, and normally, a material such as fluoric system resin or quartz is used. However, there are both advantages and disadvantages in using such materials for the cleaning carrier 501. Drawbacks that are common to the use of both of these materials are that (i) it is impossible to avoid the wafers 500 from being contaminated by the cleaning carrier 501 because the wafers 500 are accommodated within the cleaning carrier 501 and transported, (ii) the exposure of the wafers 500 is small because the cleaning carrier 501 is used and the times required for the chemical process and the washing process increase depending on the limited exposure of the wafers 500, and (iii) it is impossible to avoid the chemical from being carried outside the chemical chamber 503 when removing the wafers 500 from the chemical chamber 503 because the cleaning carrier 501 is used and the amount of the chemical used increases.

In order to overcome such drawbacks associated by the use of the cleaning carrier, so-called carrierless (or no-carrier) type substrate processing apparatuses that use no carrier have been proposed in Japanese Laid-Open Patent Applications No. 4-49619 and No. 5-36668, for example.

FIGS. 2A and 2B show a second example of a conventional substrate processing apparatus. FIG. 2A is a front view showing the second conventional substrate processing apparatus in a state where wafers have been transported to a chemical chamber. FIG. 2B is a side view showing by a dotted line the second conventional substrate processing apparatus in a state where the wafers are transported to the chemical chamber or are transported outside the chemical chamber, and showing by the solid line the second conventional substrate processing apparatus in a state where wafers have been transported to the chemical chamber. For the sake of convenience, it will be assumed that the second conventional substrate processing apparatus is a chemical substrate surface preparation apparatus for cleaning the wafers. In FIGS. 2A and 2B, those parts which are the same as those corresponding parts in FIGS. 1A and 1B are designated by the same reference numerals, and a description thereof will be omitted.

According to the second conventional substrate processing apparatus, a plurality of holding parts 502B are provided on the arms 502A of the transport robot 502. A number of grooves corresponding to the number of wafers 500 to be held are formed on the holding part 502B. When the wafers 500 are transported, each wafer 500 is held solely by the holding parts 502B. The wafers 500 transported into the chemical chamber 503 are supported by a wafer support 505 that is provided within the chemical chamber 503. A number of grooves corresponding to the number of wafers 500 to be supported are formed on the wafer support 505. The wafers 500 within the chemical chamber 503 are supported by the grooves of the wafer support 505, and the pitch with which the wafers 500 are arranged is maintained constant by the grooves.

According to the second conventional substrate processing apparatus shown in FIGS. 2A and 2B, only the wafers 500 are held and transported by the arms 502A of the transport robot 502. For this reason, compared to the first conventional substrate processing apparatus shown in FIGS. 1A and 1B, it is possible to avoid the wafers 500 from becoming contaminated by the cleaning carrier because no cleaning carrier is used. In addition, the wafers 500 are satisfactorily exposed within the chemical chamber 503 because no cleaning carrier is used, thereby requiring no additional time to carry out the chemical process and the washing process. Furthermore, since no cleaning carrier is used to remove the wafers 500 from the chemical chamber 503, it is possible to prevent the chemical from being carried outside the chemical chamber 503 when removing the wafers 500 from the chemical chamber 503, and the consumption of the chemical will not increase.

However, according to the second conventional substrate processing apparatus shown in FIGS. 2A and 2B, the plurality of separate wafers 500 must be held by the arms 502A of the transport robot 502, and the plurality of separate wafers 500 must be supported by the wafer support 505 within the chemical chamber 503. In other words, the plurality of grooves for holding the ends of the wafers 500 must be provided on the holding part 502B of the arm 502A with a high accuracy, so that each wafer 500 stand approximately straight at the constant pitch. In addition, the plurality of grooves for supporting the ends of the wafers 500 must be provided on the wafer support 505 within the chemical chamber 503 with a high accuracy, so that each wafer 500 stand approximately straight at the constant pitch within the chemical chamber 503. For these reasons, it was impossible to manufacture the holding parts 502B and the wafer support 505 at a low cost.

For example, in the case of the wafer 500 having a diameter of 6 inches and a thickness of 0.6 mm, the width of the grooves provided on the holding parts 502B of the arm 502A and on the wafer support 505 is approximately 0.8 mm. For this reason, when transporting the wafers 500 into the chemical chamber 503 or transporting the wafers 500 outside the chemical chamber 503 by the transport robot 502, there was a problem in that an extremely accurate positioning control was required so as to ensure positive catching of the wafers 500 and to prevent damage to the wafers 500 such as chipping. In addition, even if such an extremely accurate positioning control is made, the transport reliability is considerably poor compared to the first conventional substrate processing apparatus that uses the cleaning carrier. As various parts of the second conventional substrate processing apparatus deteriorate with time, the transport reliability becomes unpredictable, and the damage to the wafers 500 in an extreme case is much greater when compared to the first conventional substrate processing apparatus.

Furthermore, because the second conventional substrate processing apparatus holds the wafers 500 by the grooves of the holding parts 502B of the arm 502A and supports the wafers 500 by the grooves of the wafer support 505, there was another problem in that particles are generated by the contact between end surfaces of the wafers 500 and the grooves.

Accordingly, when the transport reliability and the positioning accuracy required of the transport robot 502 in particular are taken into consideration, the first conventional substrate processing apparatus is more preferable compared to the second conventional substrate processing apparatus. However, in addition to the drawbacks (i) through (iii) described above, the first conventional substrate processing apparatus also had a problem in that particles or dust particles that affect the yield of products using the wafers 500 are generated.

In other words, regardless of whether the material used for the cleaning carrier 501 is fluoric system resin or quartz, the cleaning carrier 501 generally includes a part that has the function of supporting the weights of the wafers 500 and a part that has the function of stopping the inclination of the wafers 500. Although the end surface of the wafer 500 looks smooth to the human eye, it has been confirmed that the end surface of the wafer 500 actually includes considerable undulations when viewed on a microscope with magnification of 2000 times. In addition, because the materials such as fluoric system resin and quartz used for the cleaning carrier 501 are softer than silicon that is used for the wafers 500, the cleaning carrier 501 is scraped and damaged by the undulations at the end surfaces of the wafers 500 every time the cleaning carrier 501 is used. More particularly, it has been confirmed that fine scratches and cracks are generated at the damaged part of the cleaning carrier 501 that supports the wafers 500.

The scratches and cracks in the cleaning carrier 501 generate the particles. It has also been confirmed that the wafers 500 become more contaminated by the particles as the number of times the cleaning carrier 501 is used increases. The contamination of the wafers 500 is caused by the particles that are generated from the cleaning carrier 501, float at the liquid surface within the chemical chamber 503, and adhere on the surface of the wafers 500 when the cleaning carrier 501 is transported into or out of the chemical chamber 503.

Accordingly, the present inventor studied the cleaning carriers 501 that have been used for a certain extent, so as to analyze the deteriorated portions of the grooves.

FIGS. 3A and 3B show an example of the cleaning carrier 501 that has been used. FIG. 3A is a plan view showing an important top part of the cleaning carrier 501, and FIG. 3B is a cross sectional view showing a vertical cross section of the cleaning carrier 501 shown in FIG. 3A viewed from the front.

A part X1 shown in FIG. 3B has the function of stopping the inclination of the wafer 500. As shown in a cross section in FIG. 4A, an end surface 500A of the wafer 500 does not make direct contact with an innermost wall portion of the cleaning carrier 501 at this part X1. Since inner walls forming the groove simply stop the inclination of the wafer 500, there is virtually no particle generation at the part X1.

On the other hand, a part X2 shown in FIG. 3B has the function of supporting the weight of the wafer 500. As shown in a cross section in FIG. 4B, the end surface 500A of the wafer 500 makes direct contact with the innermost wall portion of the cleaning carrier 501 at this part X2. Because this part X2 substantially supports the entire weight of the wafer 500, there is considerable deterioration of the inner wall of the cleaning carrier 501 due to the contact between the end surface 500A of the wafer 500 and the inner wall of the cleaning carrier 501, and considerable particle generation occurs.

FIGS. 5A and 5B show another example of the cleaning carrier 501 that has been used. FIG. 5A is a plan view showing an important top part of the cleaning carrier 501, and FIG. 5B is a cross sectional view showing a vertical cross section of the cleaning carrier 501 shown in FIG. 5A viewed from the front.

A part X3 shown in FIG. 5B has the function of stopping the inclination of the wafer 500. As shown in a cross section in FIG. BA, an end surface 500A of the wafer 500 does not make direct contact with an innermost wall portion of the cleaning carrier 501 at this part X3. Since inner walls forming the groove simply stop the inclination of the wafer 500, there is virtually no particle generation at the part X3.

On the other hand, a part X4 shown in FIG. 5B has the function of supporting the weight of the wafer 500. As shown in a cross section in FIG. 5B, the end surface 500A of the wafer 500 makes direct contact with the innermost wall portion of the cleaning carrier 501 at this part X4. Because this part X4 substantially supports the entire weight of the wafer 500, there is considerable deterioration of the inner wall of the cleaning carrier 501 due to the contact between the end surface 500A of the wafer 500 and the inner wall of the cleaning carrier 501, and considerable particle generation occurs.

Therefore, both the first and second conventional substrate processing apparatuses have advantages and disadvantages. Hence, there was a problem in that the particles are generated by the use of the cleaning carrier 501 and the wafers 500 are contaminated by the particles or, that extremely accurate positioning control is required when transporting the wafers 500 by the transport robot 502 so that the wafers 500 are positively caught.

SUMMARY OF THE INVENTION

Accordingly, it is a general object of the present invention to provide a novel and useful substrate processing apparatus in which the problems described above are eliminated.

Another and more specific object of the present invention is to provide a substrate processing method comprising the steps of (a) accommodating a plurality of substrates within a carrier, where the carrier has a bottom that is open and has a function of stopping inclination of the substrates, (b) transporting the substrates and the carrier to a processing chamber by a transport means having a function of supporting weights of the substrates, and (c) carrying out a process on the substrates within the processing chamber.

According to the substrate processing method of the present invention, it is possible to greatly suppress the generation of particles when compared to the first conventional substrate processing apparatus. In addition, the service life of the carrier can be extended, the amount of chemical carried outside the processing chamber is small, and the processing time can be reduced. Compared to the second conventional substrate processing apparatus, it is possible to greatly improve the reliability of the substrate transport. Furthermore, the construction of the transport means can be simple and an inexpensive transport means can be used. Moreover, an extremely accurate positioning control is not required of the transport means.

Still another object of the present invention is to provide a substrate processing apparatus comprising transport means for transporting a plurality of substrates and a carrier that accommodates the substrates by supporting weights of the substrates, where the carrier has a bottom that is open and has a function of stopping inclination of the substrates, and processing chamber supporting the substrates and the carrier transported by the transport means and subjecting the substrates to a process.

According to the substrate processing apparatus of the present invention, it is possible to greatly suppress the generation of particles when compared to the first conventional substrate processing apparatus. In addition, the service life of the carrier can be extended, the amount of chemical carried outside the processing chamber is small, and the processing time can be reduced. Compared to the second conventional substrate processing apparatus, it is possible to greatly improve the reliability of the substrate transport. Furthermore, the construction of the transport means can be simple and an inexpensive transport means can be used. Moreover, an extremely accurate positioning control is not required of the transport means.

A further object of the present invention is to provide a method of transporting substrates comprising the steps of (a) accommodating a plurality of substrates within a carrier, where the carrier has a bottom that is open and has a function of stopping inclination of the substrates, and (b) transporting the substrates and the carrier by a transport means having a function of supporting weights of the substrates.

According to the method of transporting substrates of the present invention, it is possible to greatly suppress the generation of particles when compared to the first conventional substrate processing apparatus. In addition, the service life of the carrier can be extended, the amount of chemical carried outside the processing chamber is small, and the processing time can be reduced. Compared to the second conventional substrate processing apparatus, it is possible to greatly improve the reliability of the substrate transport. Furthermore, the construction of the transport means can be simple and an inexpensive transport means can be used. Moreover, an extremely accurate positioning control is not required of the transport means.

Other objects and further features of the present invention will be apparent from the following detailed description when read in conjunction with the accompanying drawings.

BRIEF DESCRIPTION OF THE DRAWINGS

FIGS. 13A and 13B respectively are a front view and a side view showing a fifth embodiment of the substrate processing apparatus according to the present invention;

FIGS. 14A and 14B respectively are a front view and a side view showing a sixth embodiment of the substrate processing apparatus according to the present invention;

FIGS. 15A and 15B respectively are a front view and a side view showing a seventh embodiment of the substrate processing apparatus according to the present invention;

FIGS. 17A, 17B and 17C respectively are a plan view, a front view and a side view showing a first embodiment of a carrier;

DESCRIPTION OF THE PREFERRED EMBODIMENTS

A description will be given of a first embodiment of a substrate processing apparatus according to the present invention, by referring to FIGS. 7 through 9.

Figure 7B:
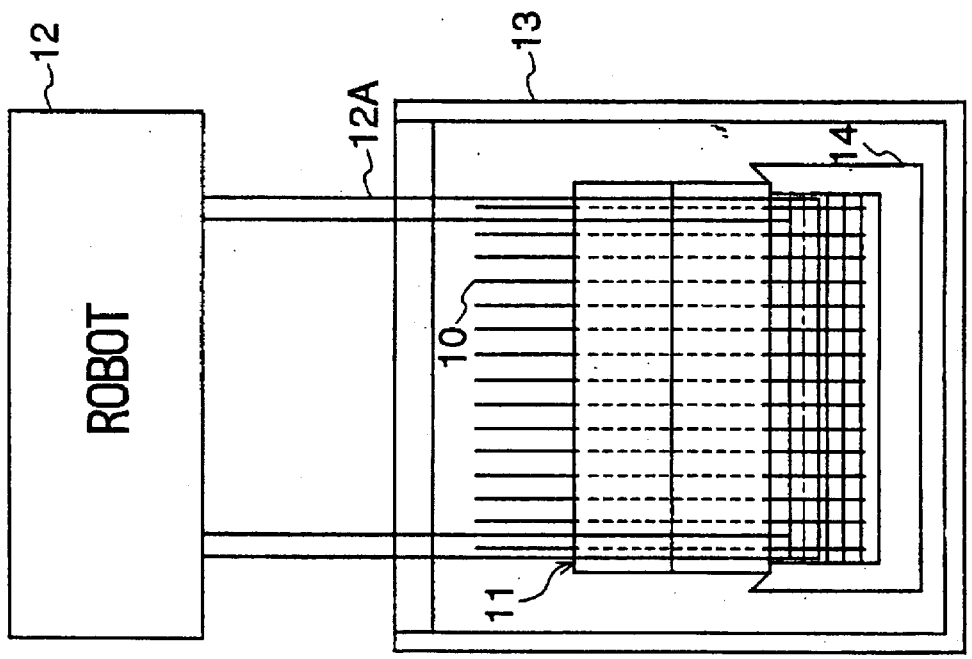
FIGS. 7A and 7B respectively are front views showing a first embodiment of a substrate processing apparatus according to the present invention.
Figure 7A:
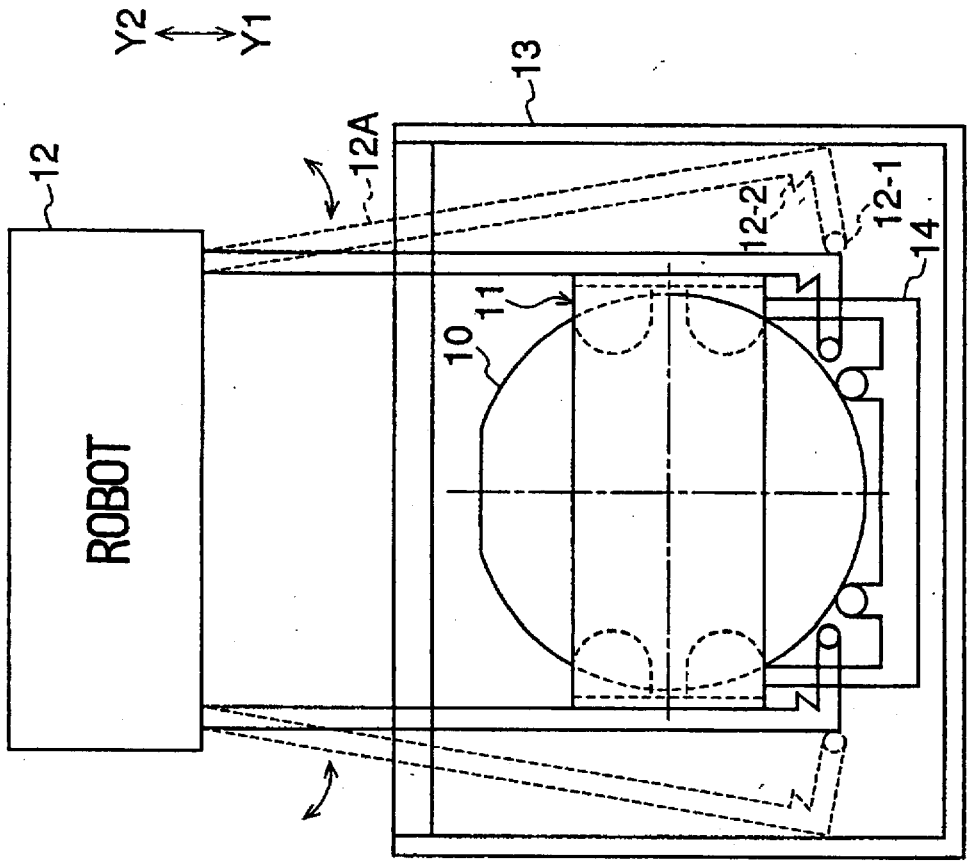
Figure 8B:
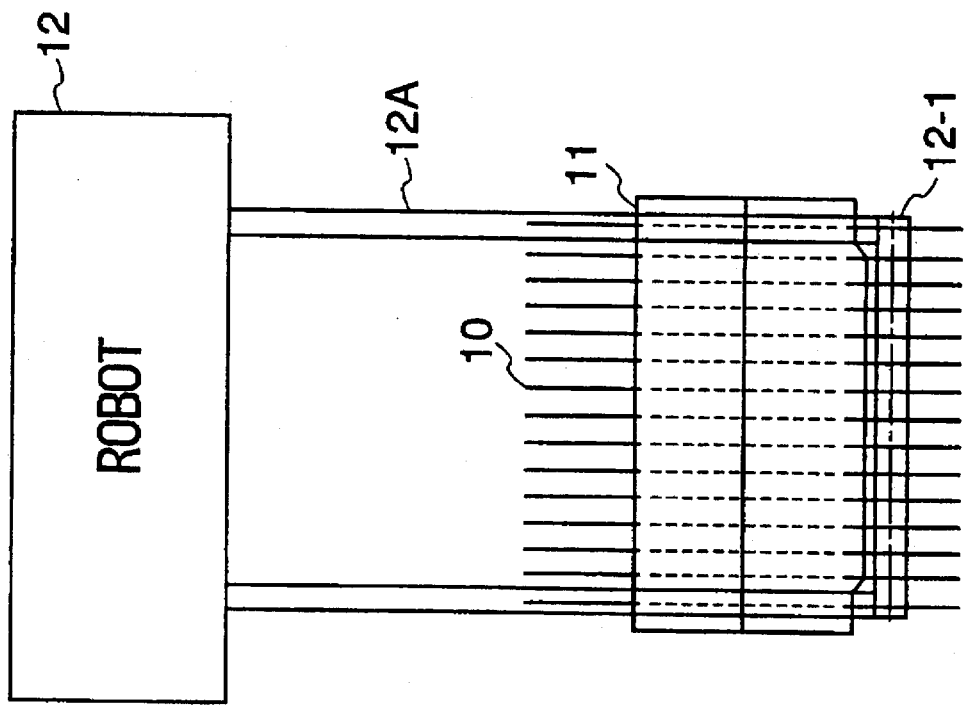
FIGS. 8A and 8B respectively are front views for explaining transport of wafers in the first embodiment.
Figure 8A:
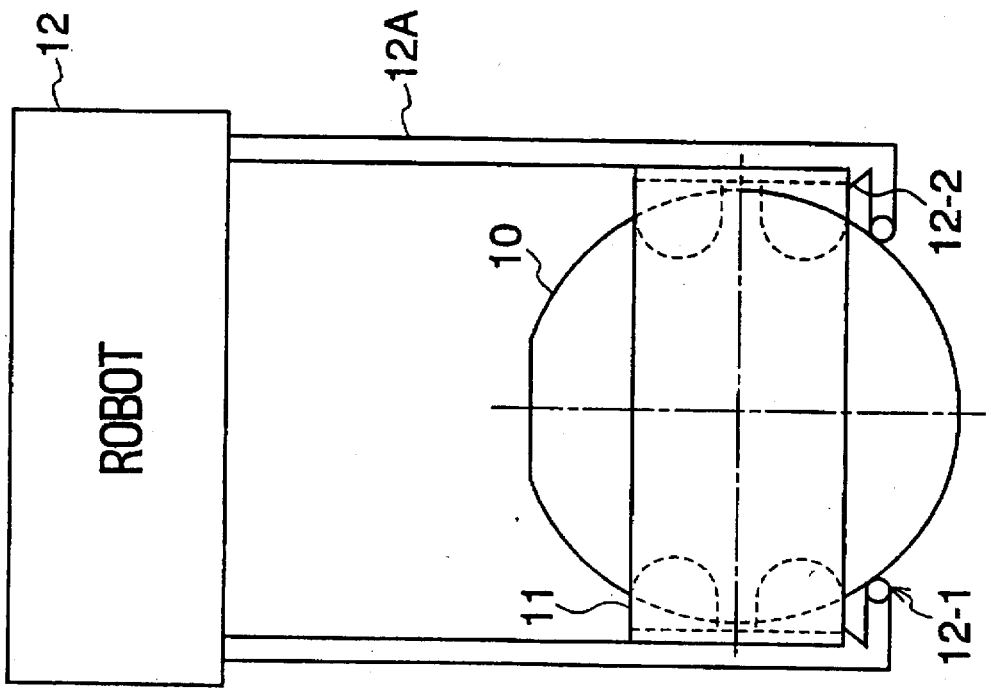

FIGS. 7A and 7B respectively are a front view and a side view showing the first embodiment in a state where wafers have been transported to a chemical chamber. FIGS. 8A and 8B respectively are a front view and a side view showing the first embodiment in a state where the wafers are transported to the chemical chamber or are transported outside the chemical chamber. In addition, FIGS. 9A and 9B respectively are a front view and a side view showing the first embodiment in a state where the wafers are supported within the chemical chamber. For the sake of convenience, it will be assumed that in this embodiment the present invention is applied to a chemical substrate surface preparation apparatus which cleans the wafers.

In this first embodiment, a plurality of wafers 10 are accommodated within a carrier 11 and transported. However, the carrier 11 is constructed to only stop the inclination of the wafers 10, and the carrier 11 by itself does not have the function of supporting the weights of the wafers 10. Accordingly, each wafer 10 will slip out of the carrier 11 unless supported. In addition, since the carrier simply needs to have the function of only stopping the inclination of the wafers 10, the carrier 11 does not need to cover the wafers 10 in their entirety and the carrier 11 only has to have a shape that is sufficient to stop the inclination of the wafers 10. In this embodiment, the carrier 11 only covers the central part of the wafers 10, and the inclination of the wafers 10 is stopped by a plurality of grooves or slots formed at both ends of the carrier 11.

A detailed description on the grooves or slots of the carrier 11 will be given later on in the specification.

A transport robot 12 holds the wafers 10 and the carrier 11 by arms 12A as shown in FIGS. 8A and 8B, and moves in a direction Y1 so as to transport the wafers 10 to a chemical chamber 13 together with the carrier 11. In this state, the wafers 10 are held by wafer holding parts 12-1 provided at tip ends of the arms 12A, and the weights of the wafers 10 are supported by the wafer holding parts 12-1. In addition, carrier stoppers 12-2 of the arms 12A support the carrier 11 so that the carrier 11 will not fall during transport of the wafers 10. As a result, the positional shift of the wafer 10 and the carrier 11 during the transport is prevented by the wafer holding parts 12-1 and the carrier stoppers 12-2 of the arms 12A. Since the inclination of the wafers 10 is stopped by the carrier 11, the wafer holding parts 12-1 of the arms 12A simply need to support the wafers 10, and there is no need to provide grooves for supporting the wafers 10 as in the case of the second conventional substrate processing apparatus described above. For this reason, the positioning accuracy required of the transport robot 12 is similar to that of the first conventional substrate processing apparatus described above, and there is no need for an extremely accurate positioning control as required by the second conventional substrate processing apparatus. In this embodiment, the wafer holding parts 12-1 of the arms 12A are formed by a pair of rod shaped members.

Figure 9B:
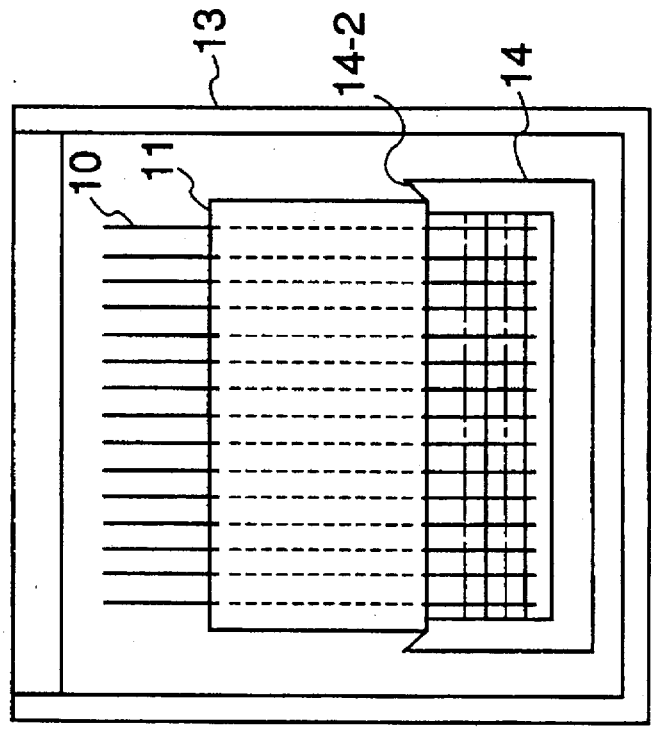
FIGS. 9A and 9B respectively are a front view and a side view for explaining support of the wafers in a chemical chamber of the first embodiment.
Figure 9A:
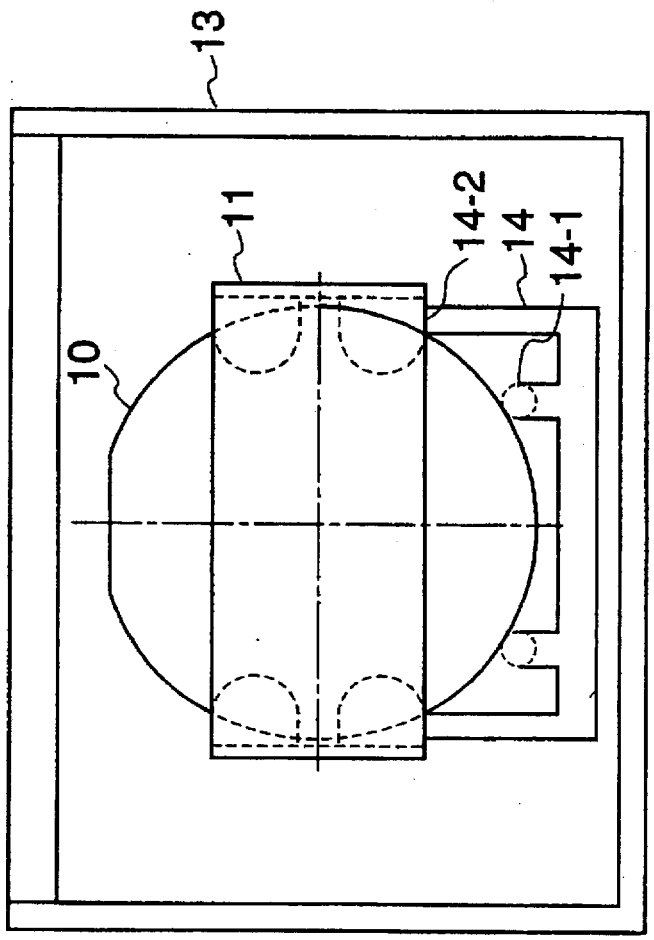

Thereafter, the arms 12A turn in directions of arrows as indicated by a dotted line in FIG. 7A, so as to place the wafers 10 and the carrier 11 on a support 14 within the chemical chamber 13. In this state, the wafers 10 are supported by wafer supports parts 14-1 of the support 14 as shown in FIGS. 9A and 9B, and the carrier 11 is supported by carrier support parts 14-2 of the support 14. The wafer support parts 14-1 simply need to support the weights of the wafers 10, and there is no need to provide the grooves for supporting the wafers 10 as in the case of the second conventional substrate processing apparatus. Hence, the positioning accuracy required of the transport robot 12 is similar to that of the first conventional substrate processing apparatus, and there is no need for an extremely accurate positioning control as required by the second conventional substrate processing apparatus. In addition, although the carrier support parts 14-2 of this embodiment are tapered as shown in FIG. 9B, the carrier support parts 14-2 only need to have a construction that would support the weight of the carrier 11 placed thereon. Accordingly, there is no need for a complicated support structure and a highly accurate transport and positioning for the carrier 11, and all that is required is for the carrier 11 to be positioned on the support 14 by its own weight.

After cleaning the wafers 10, the arms 12A turn from the position indicated by the dotted line to the position indicated by the solid line in FIG. 7A, so as to hold the wafers 10 and the carrier 11. The wafers 10 and the carrier 11 held by the arms 12A are moved in a direction Y2 in FIGS. 7A, 7B, 8A and 8B, and the wafers 10 are transported outside the chemical chamber 13 together with the carrier 11.

In FIGS. 7A, 7B, 8A and 8B, known mechanisms similar to those described above in conjunction with FIGS. 1A, 1B, 2A and 2B, for example, may be used for the transport robot 12 itself, the driving system for the arms 12A and the like. Accordingly, a description on such mechanisms will be omitted in this specification.

In this embodiment, the carrier 11 has no part for supporting the weights of the wafers 10, and the carrier 11 has no grooves for supporting the wafers 10. Thus, unlike the first conventional substrate processing apparatus, the end surfaces of the wafers 10 will not make direct contact with the inner wall of the carrier 11 and will not scrape the inner wall of the carrier 11. For this reason, it is possible to suppress the particle generation which was a drawback in the case of the first conventional substrate processing apparatus. In addition, the inclination of the wafers 10 is stopped by the carrier 11. Hence, unlike the second conventional substrate processing apparatus, no grooves are formed on the side of neither the transport robot 12 nor the chemical chamber 13 for the purposes of stopping the inclination of the wafers 10. As a result, the construction of this embodiment of the substrate processing apparatus is simple, and the apparatus itself becomes inexpensive. It is possible to positively catch the wafers 10 without the need for an extremely accurate positioning control when transporting the wafers 10. Moreover, since the wafer holding parts 12-1 and the wafer supporting parts 14-1 do not have grooves, there is no contact between the end surfaces of the wafers 10 and the grooves that would cause the particle generation.

On the other hand, compared to the cleaning carrier 501 of the first conventional substrate processing apparatus, the carrier 11 is relatively small. Accordingly, although the carrier 11 is used, there is virtually no increase in the size of the chemical chamber 13. In addition, the amount of chemical that is taken out of the chemical chamber 13 during the transport of the wafers 10 is essentially the same as that in the case of the second conventional substrate processing apparatus, and the processing time of the wafers 10 is also essentially the same as that of the second conventional substrate processing apparatus. Furthermore, because the carrier 11 has no part that makes direct contact with the end surfaces of the wafers 10, the service life of the carrier 11 itself is long. Moreover, since the construction of the carrier 11, the wafer holding parts 12-1 and the wafer support parts 14-1 are simple, the maintenance of these parts including replacement of the worn parts can be carried out by a simple operation.

In this embodiment, the carrier 11 is made of a material such as fluoric system resin, quartz and PTFE typified by TEFLON (registered trademark). Of course, only the surfaces of the carrier 11 may be made of such materials.

The materials used for the arms 12A of the transport robot 12, and the wafer holding parts 12-1, the support 14 and the wafer support parts 14-1 within the chemical chamber 13 are not limited to a special material. For example, a plastic that does not deteriorate when exposed to the chemical used within the chemical chamber is and can also suppress the particle generation, the materials used for the carrier 11 and the like may be used for these parts of the substrate processing apparatus.

Figure 10A:
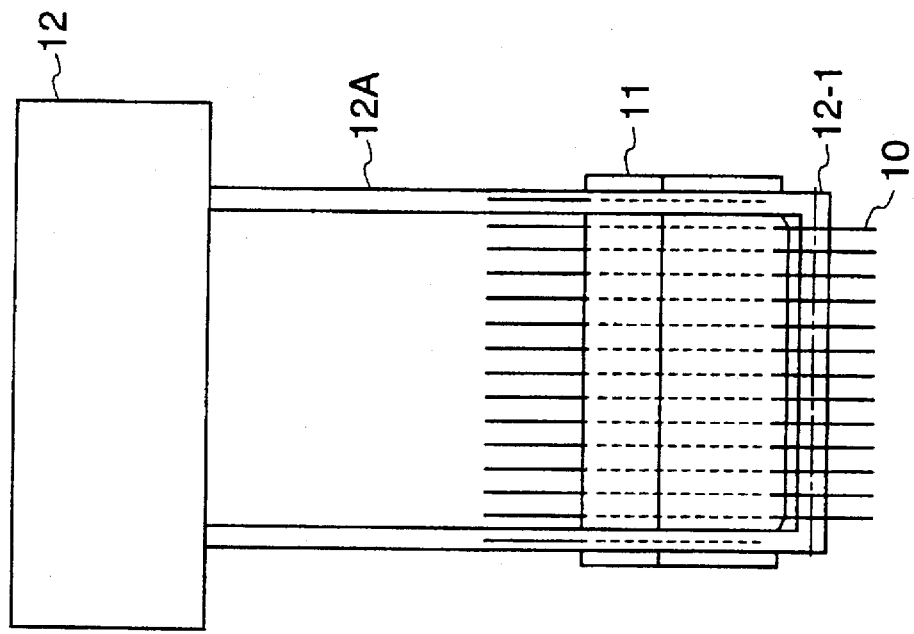
FIGS. 10A and 10B respectively are a front view and a side view showing a second embodiment of the substrate processing apparatus according to the present invention.
Figure 10B:
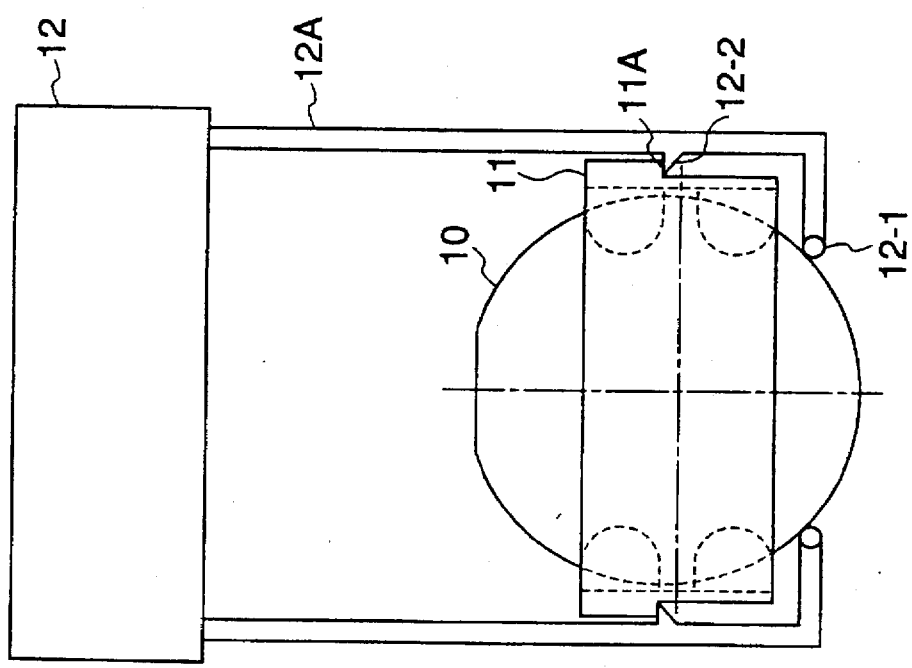

Next, a description will be given of a second embodiment of the substrate processing apparatus according to the present invention, by referring to FIGS. 10A and 10B. FIGS. 10A and 10B respectively are a front view and a side view showing the second embodiment in a state where the wafers are transported. In FIGS. 10A and 10B, those parts which are the same as those corresponding parts in FIGS. 7A through 9B are designated by the same reference numerals, and a description thereof will be omitted. In addition, in the description of this embodiment and the subsequent embodiments, it will be assumed that the present invention is applied to a chemical substrate surface preparation apparatus that cleans the wafers.

In this second embodiment, stepped parts 11A are provided on side walls of the carrier 11. Hence, the carrier holding parts 12-2 of the arms 12A hold the bottom of carrier 11 in the first embodiment, but the carrier holding parts 12-2 hold the sides of the carrier 11 in this second embodiment.

Figure 11B:
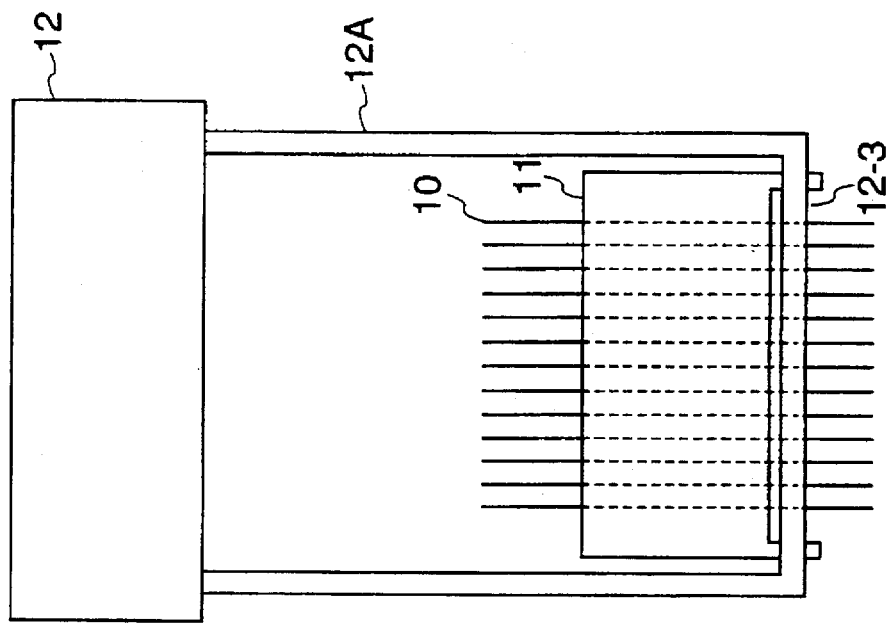
FIGS. 11A and 11B respectively are a front view and a side view showing a third embodiment of the substrate processing apparatus according to the present invention.
Figure 11A:
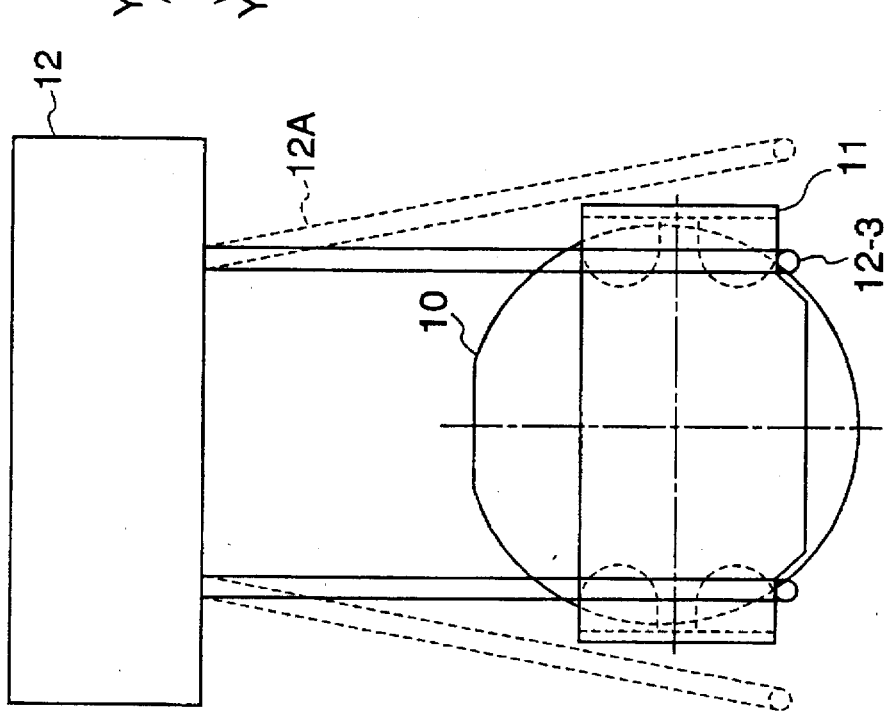

Next, a description will be given of a third embodiment of the substrate processing apparatus according to the present invention, by referring to FIGS. 11A and 11B. FIGS. 11A and 11B respectively are a front view and a side view showing the third embodiment in a state where the wafers are transported. In FIGS. 11A and 11B, those parts which are the same as those corresponding parts in FIGS. 7A through 9B are designated by the same reference numerals, and a description thereof will be omitted.

In this third embodiment, common holding parts 12-3 are provided at the tip ends of the arms 12A. In the first and second embodiments, the wafers 10 and the carrier 11 are held by different parts of the arms 12A. However, in this third embodiment, the wafers 10 and the carrier 11 are simultaneously held by the common holding parts 12-3.

In addition, in this third embodiment, the tip ends of the arms 12A do not have an L-shaped portion that curves inward, and the arms 12A have a straight shape. Furthermore, the arms 12A do not have projections for holding the carrier 11. Because the arms 12A of the transport robot 12 normally passes through a plurality of chemical chambers and washing chambers, the simple shape of the arms 12A is convenient in that the dust particles and the liquids are unlikely to become accumulated on the arms 12A.

Figure 12B:
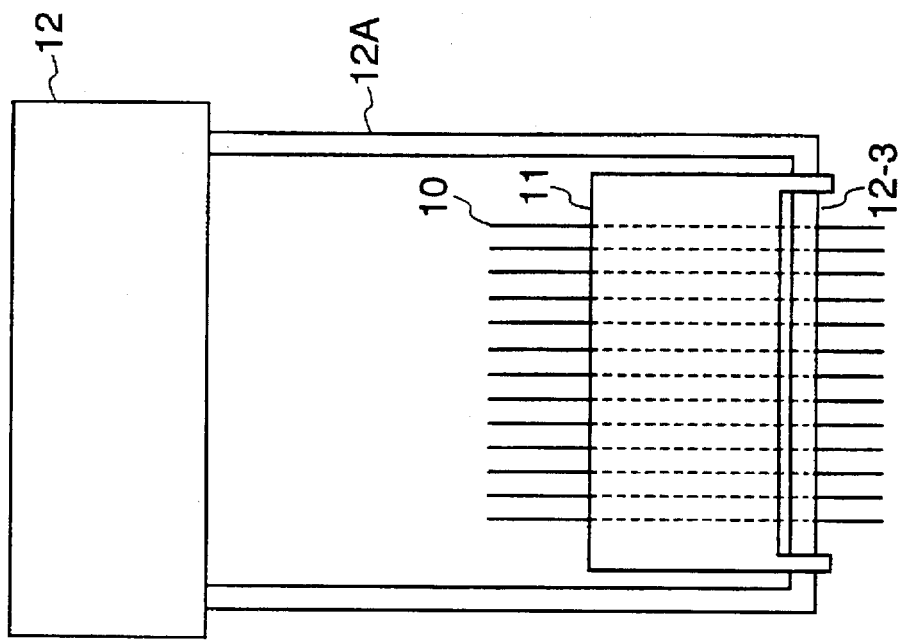
FIGS. 12A and 12B respectively are a front view and a side view showing a fourth embodiment of the substrate processing apparatus according to the present invention.
Figure 12A:
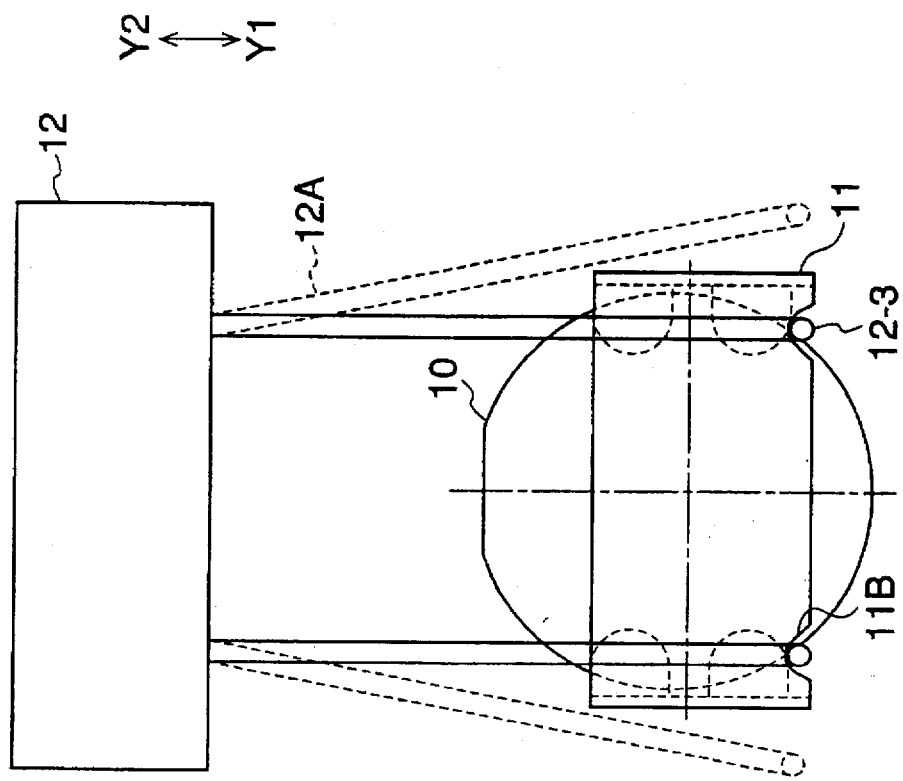

Next, a description will be given of a fourth embodiment of the substrate processing apparatus according to the present invention, by referring to FIGS. 12A and 12B. FIGS. 12A and 12B respectively are a front view and a side view showing the fourth embodiment in a state where the wafers are transported. In FIGS. 12A and 12B, those parts which are the same as those corresponding parts in FIGS. 11A through 11B are designated by the same reference numerals, and a description thereof will be omitted.

In this fourth embodiment, depressions 11B are formed on the bottom of the carrier 11. The common holding parts 12-3 on the tip ends of the arms 12A engage the depressions 11B of the carrier 11 when simultaneously holding the wafers 10 and the carrier 11. Accordingly, it is possible to positively prevent the wafers 10 and the carrier 11 from falling even if the transport robot 12 suddenly stops or the like.

Next, a description will be given of a fifth embodiment of the substrate processing apparatus according to the present invention, by referring to FIGS. 13A and 13B. FIGS. 13A and 13B respectively are a front view and a side view showing the fifth embodiment in a state where the wafers are transported. In FIGS. 13A and 13B, those parts which are the same as those corresponding parts in FIGS. 7A through 9B are designated by the same reference numerals, and a description thereof will be omitted.

In this fifth embodiment, sawtooth shaped portions 12-1A are provided on the wafer holding parts 12-1 at the tip ends of the arms 12A. A part of the sawtooth shaped portion 12-1A is shown on an enlarged scale at the bottom left of FIG. 13B. A pitch of the valleys or mountains of the sawtooth shaped portion 12-1A is set smaller than the pitch of the wafers 10 within the carrier 11. The sawtooth shaped portion 12-1A may be made up of a continuous spiral groove or projection.

Each wafer 10 within the carrier 11 may make contact with an adjacent wafer 10 at the upper most or lowermost portion depending on the angle of the opening of the groove or slot formed on the carrier 11. If such a contact of the adjacent wafers 10 occurs, the cleaning, drying or the like may not be carried out uniformly with respect to each of the wafers 10 within the carrier 11 and with respect to the entire surface of each wafer 10. The contact of the adjacent wafers 10 occurs when the inclination angle of the wafer 10 becomes greater than a predetermined angle, however, the cleaning, drying and the like with respect to the wafers 10 cannot be made uniformly also when the grooves of the carrier are too deep or the width of the grooves is too narrow. Hence, in this fifth embodiment, the sawtooth shaped portions 12-1A are provided on the wafer holding parts 12-1, instead of making the grooves of the carrier 11 deep or narrow. As a result, it is possible to prevent the end portions of the wafers 10 from slipping unprepared. In addition, it is possible to effectively suppress the particle generation because the slipping of the wafers 10 can be prevented.

Next, a description will be given of a sixth embodiment of the substrate processing apparatus according to the present invention, by referring to FIGS. 14A and 14B. FIGS. 14A and 14B respectively are a front view and a side view showing the sixth embodiment in a state where the wafers have been transported to the chemical chamber. In FIGS. 14A and 14B, those parts which are the same as those corresponding parts in FIGS. 9A and 9B are designated by the same reference numerals, and a description thereof will be omitted.

In this sixth embodiment, sawtooth shaped portions 14-1A are provided on the wafer support parts 14-1 of the support 14 within the chemical chamber 13. A part of the sawtooth shaped portion 14-1A is shown on an enlarged scale at the bottom left of FIG. 14B. A pitch of the valleys or mountains of the sawtooth shaped portion 14-1A is set smaller than the pitch of the wafers 10 within the carrier 11. The sawtooth shaped portion 14-1A may be made up of a continuous spiral groove or projection.

In this sixth embodiment, the sawtooth shaped portions 14-1A are provided on the wafer support parts 14-1, instead of making the grooves of the carrier 11 deep or narrow. As a result, it is possible to prevent the end portions of the wafers 10 from slipping unprepared within the chemical chamber 13, by an operating principle similar to that of the fifth embodiment described above. In addition, it is possible to effectively suppress the particle generation because the slipping of the wafers 10 within the chemical chamber 13 can be prevented.

Next, a description will be given of a seventh embodiment of the substrate processing apparatus according to the present invention, by referring to FIGS. 15A and 15B. FIGS. 15A and 15B respectively are a front view and a side view showing the seventh embodiment in a state where the wafers are transported. In FIGS. 15A and 15B, those parts which are the same as those corresponding parts in FIGS. 7A through 9B are designated by the same reference numerals, and a description thereof will be omitted.

In this seventh embodiment, the arms 12A are mounted so that a direction in which the arms 12A of the transport robot 12 extends is inclined from the direction of gravity (Y1). In other words, in FIG. 15B, the arms 12A are mounted with an inclination of 2° to 3° from the direction Y1, for example, so that the right side of the carrier 11 held by the arms 12A is slightly raised. For this reason, the wafers 10 are transported in a state where the surfaces of the wafers 10 are slightly deviated from the state parallel to the direction of gravity (Y1), and the wafers 10 will not move unprepared during the transport.

Figure 16:
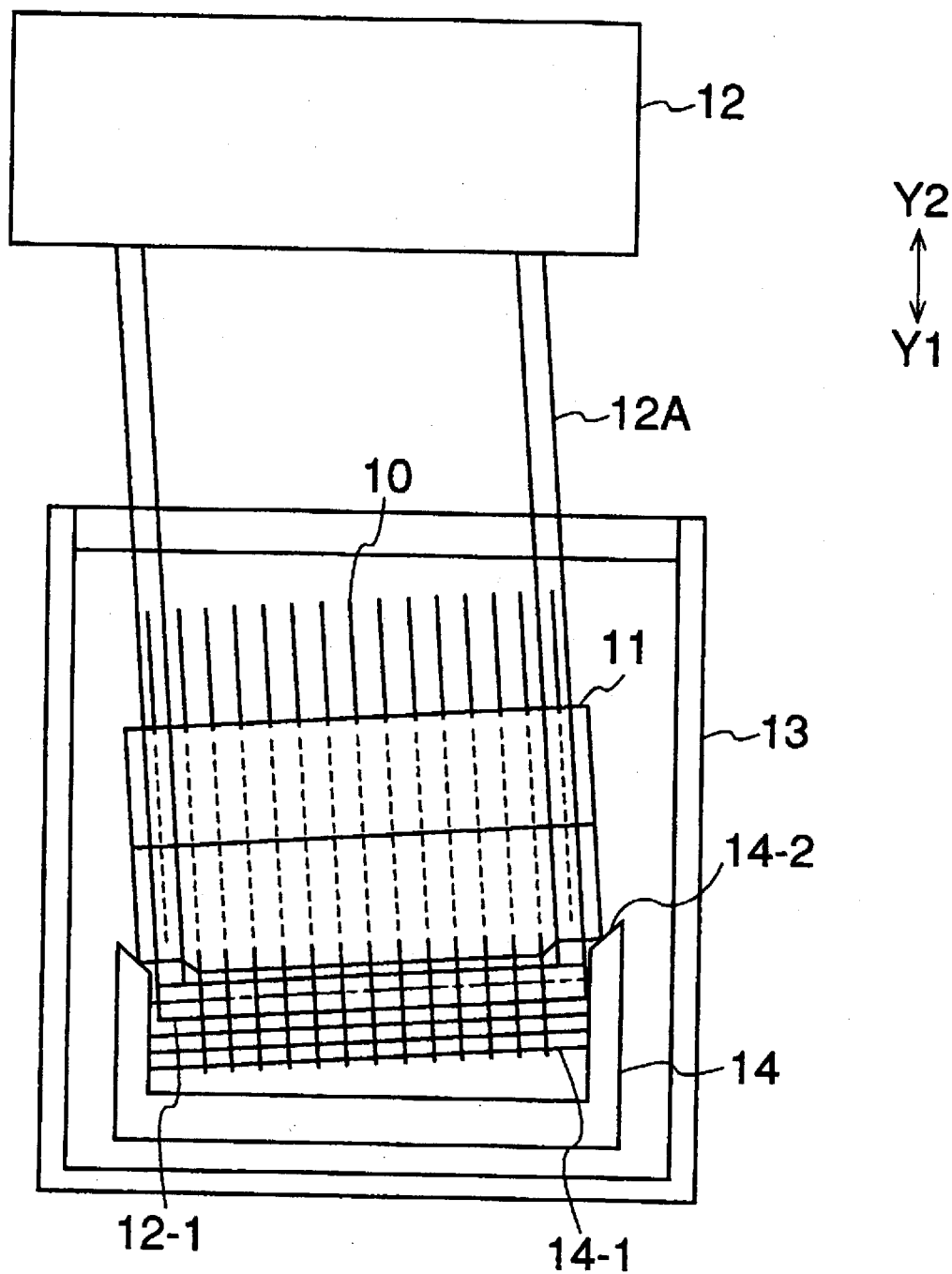
FIG. 16 is a side view showing the seventh embodiment in a state where the wafers are transported into the chemical chamber.

On the other hand, the support 14 within the chemical chamber 13 is also inclined or sloped as shown in FIG. 16. Hence, the wafers 10 and the carrier 11 can be supported on the support 14 within the chemical chamber 13 at approximately the same inclination (2° to 3°) as that of the wafers 10 in the state where the wafers 10 are transported together with the carrier 11. Therefore, the wafers 10 will not move unprepared when a process is carried out within the chemical chamber 13.

Each wafer 10 within the carrier 11 may make contact with an adjacent wafer 10 at the upper most or lowermost portion depending on the angle of the opening of the groove or slot formed on the carrier 11. If such a contact of the adjacent wafers 10 occurs, the cleaning, drying or the like may not be carried out uniformly with respect to each of the wafers 10 within the carrier 11 and with respect to the entire surface of each wafer 10. The contact of the adjacent wafers 10 occurs when the inclination angle of the wafer 10 becomes greater than a predetermined angle, however, the cleaning, drying and the like with respect to the wafers 10 cannot be made uniformly also when the grooves of the carrier are too deep or the width of the grooves is too narrow. Hence, in this seventh embodiment, the wafers 10 and the carrier 11 are transported in an inclined position, instead of making the grooves of the carrier 11 deep or narrow. As a result, it is possible to prevent the end portions of the wafers 10 from slipping unprepared. In addition, it is possible to effectively suppress the particle generation because the slipping of the wafers 10 can be prevented.

Next, a description will be given of various embodiments of the carrier 11, by referring to FIGS. 17 through 20. In FIGS. 17 through 20, those parts which are the same as those corresponding parts in FIGS. 7A through 9B are designated by the same reference numerals, and a description thereof will be omitted.

FIGS. 17A through 17C show a first embodiment of the carrier 11. As shown in a plan view of FIG. 17A, the inclination of each wafer 10 is stopped by grooves or slots 11-1 provided on ends of the carrier 11. One groove 11-1 is provided at each of the right and left ends of the carrier 11 at both the top and bottom ends of the carrier 11, with respect to each wafer 10. In addition, as shown in a front view and a side view of FIGS. 17B and 17C, an opening 11-2 is formed at the central part of the carrier 11. The contact areas of the carrier 11 and the wafers 10 are reduced by reducing the absolute surface area of the carrier 11, thereby making it possible to suppress the particle generation. Furthermore, even if the particles are generated, the particles can easily escape through the opening 11-2 and are unlikely to stay within the carrier 11. As a result, the possibility of the particles adhering onto the wafers 10 within the carrier 11 is reduced.

Figure 18C:
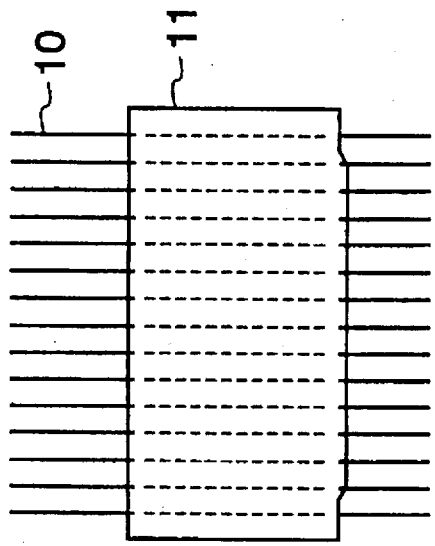
FIGS. 18A, 18B and 18C respectively are a plan view, a front view and a side view showing a second embodiment of a carrier.
Figure 18A:
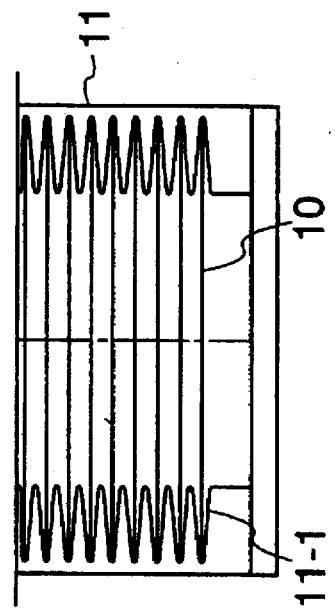
Figure 18B:
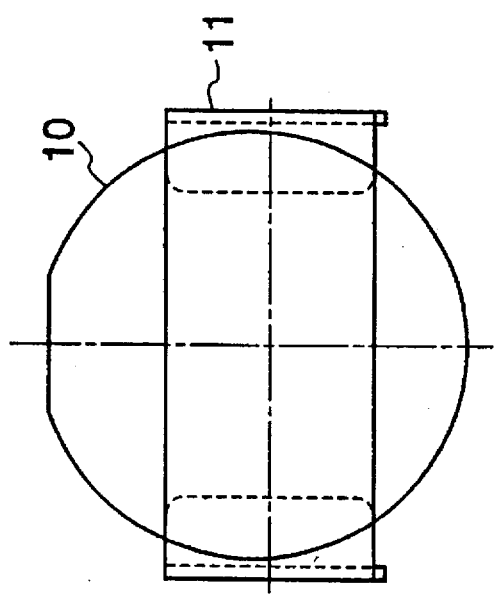

FIGS. 18A through 18C show a second embodiment of the carrier 11. As shown in a plan view of FIG. 18A, the inclination of each wafer 10 is stopped by the grooves 11-1 provided on the ends of the carrier 11. One groove 11-1 is provided at each of the right and left ends of the carrier 11, with respect to each wafer 10. In addition, as shown in a front view and a side view of FIGS. 18B and 18C, the carrier 11 has a generally frame shape. This generally frame shape of the carrier 11 has the effect of suppressing turbulent flow within the chemical chamber 13, and the particle generation is suppressed thereby. In other words, in the normal chemical chamber or washing chamber, there is a laminar flow of the liquid from the top to bottom, but a turbulent flow easily occurs at parts other than the central part within the chamber, and there is a possibility of the particles re-adhering onto the wafers 10. However, when the carrier 11 has the generally frame shape, it is easier to maintain the laminar flow within the carrier 11, and as a result, it is possible to suppress the particle generation.

Figure 19A:
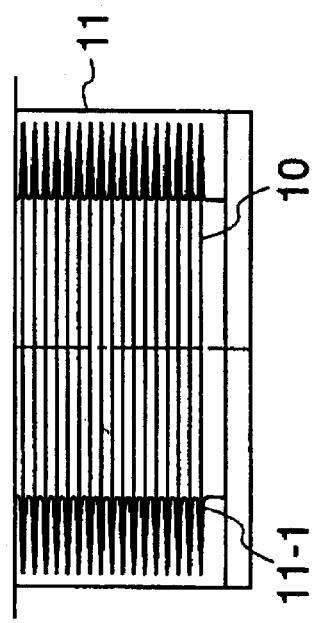
FIGS. 19A, 19B and 19C respectively are a plan view, a front view and a side view showing a third embodiment of a carrier.
Figure 19B:
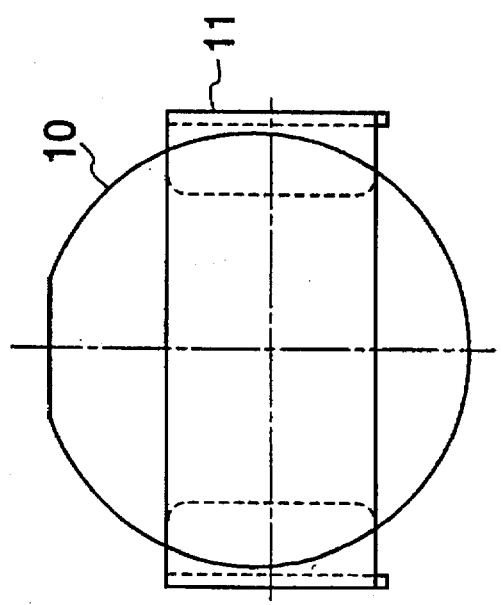
Figure 19C:
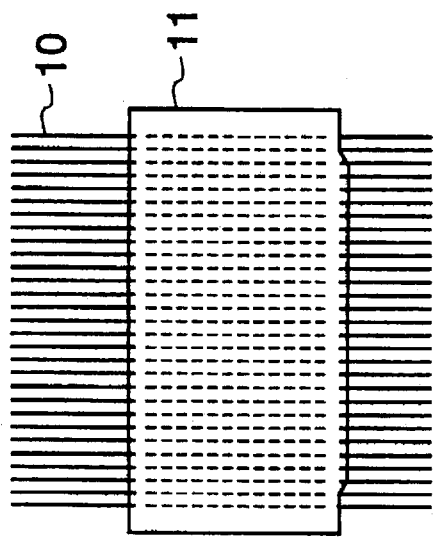

FIGS. 19A through 19C shows a third embodiment of the carrier 11. As shown in a plan view of FIG. 19A, the inclination of each wafer 10 is stopped by the grooves 11-1 provided on the ends of the carrier 11. One groove 11-1 is provided at each of the right and left ends of the carrier 11, with respect to each wafer 10. In addition, as shown in a front view and a side view of FIGS. 19B and 19C, the carrier 11 has a generally frame shape, similarly as in the case of the second embodiment of the carrier 11 shown in FIGS. 18A through 18C.

Figure 20A:
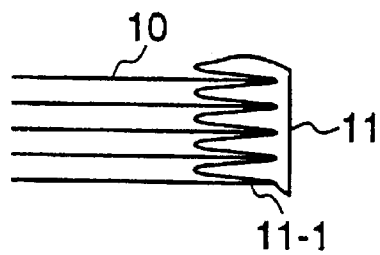
FIGS. 20A and 20B respectively are partial plan views showing a pitch of grooves in the second embodiment of the carrier and a pitch of grooves in the third embodiment of the carrier.
Figure 20B:
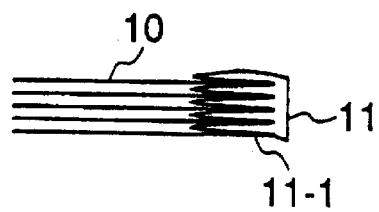

However, in this third embodiment of the carrier 11, the pitch of the grooves 11-1 of the carrier 11 is approximately one-half that of the second embodiment of the carrier 11. FIG. 20A shows the pitch of the grooves 11-1 of the carrier 11 shown in FIGS. 18A through 18C, and FIG. 20B shows the pitch of the grooves 11-1 of the carrier 11 shown in FIGS. 19A through 19C. Hence, the carrier 11 shown in FIGS. 19A through 19C can accommodate twice the number of wafers 10 that can be accommodated within the carrier shown in FIGS. 18A through 18C, and the processing speed can be increased to two times.

According to the first conventional substrate processing apparatus, when the pitch of the wafers is reduced to one-half, the particle generation is increased by the increased number of accommodated wafers. In addition, when the pitch of the wafers is reduced to one-half in the second conventional substrate processing apparatus, it was virtually impossible to accurately transport the wafers that are arranged at such a small pitch, because an extremely accurate positioning control is required of the second conventional substrate processing apparatus to start with.

On the other hand, if a maximum width of the groove 11-1 is 1.5 mm and the wafers 10 within the carrier 11 shown in FIGS. 18A through 18C are arranged at a pitch of 4.76 mm with respect to the wafers 10 having a diameter of 6 inches and a thickness of 0.6 mm, for example, the carrier 11 shown in FIGS. 19A through 19C can accommodate twice the number of wafers 10 that are accommodated in the carrier 11 shown in FIGS. 18A through 18C by reducing the pitch of the wafers 10 by one-half to 2.38 mm and appropriately adjusting the maximum width of the grooves 11-1. According to the carrier 11 shown in FIGS. 19A through 19C, the problem associated with the particle generation and the problem related to the highly accurate positioning control that is required are both eliminated.

In each of the embodiments described above, the arms of the transport robot support the wafers and the carrier at two points. However, it is of course possible for the arms to support the wafers and the carrier at more than two points.

In addition, the processing chamber in which the substrates are processed is not limited to the chemical chamber, and the present invention is applicable to any processing chamber that carries out any process with respect to the substrates. Hence, the processing chamber may be a cleaning chamber, or a drying apparatus such as a spin dryer.

Furthermore, the arms 12A of the transport robot 12 hold the wafers 10 and the carrier 11 during the transport, but the carrier 11 simply needs to be restricted from moving in the direction Y1 from the arms 12A during the transport. Hence, it is not essential for the arms 12A to completely lock the carrier 11.

Moreover, the substrates that are processed in the embodiments described above are wafers, but the substrates are of course not limited to wafers. For example, the substrates may be a reticle, a mask or the like. In addition, the shape of the substrate is not limited to the approximately circular shape of the wafer, and the substrate may have other arbitrary shapes such as a generally rectangular shape.

The shape of the carrier 11 is not limited to the hollow shape shown in FIG. 17A through 17C, for example. For example, the carrier may have an approximately sideways U-shape. Although the setting of the substrate into the carrier becomes slightly more complicated, the carrier may have a shape such that a portion or all of the top part is closed or covered. What is required of the carrier is that at least the bottom part of the carrier is open and that the carrier has the function of mainly stopping the inclination of the substrates.

Figure 1A:
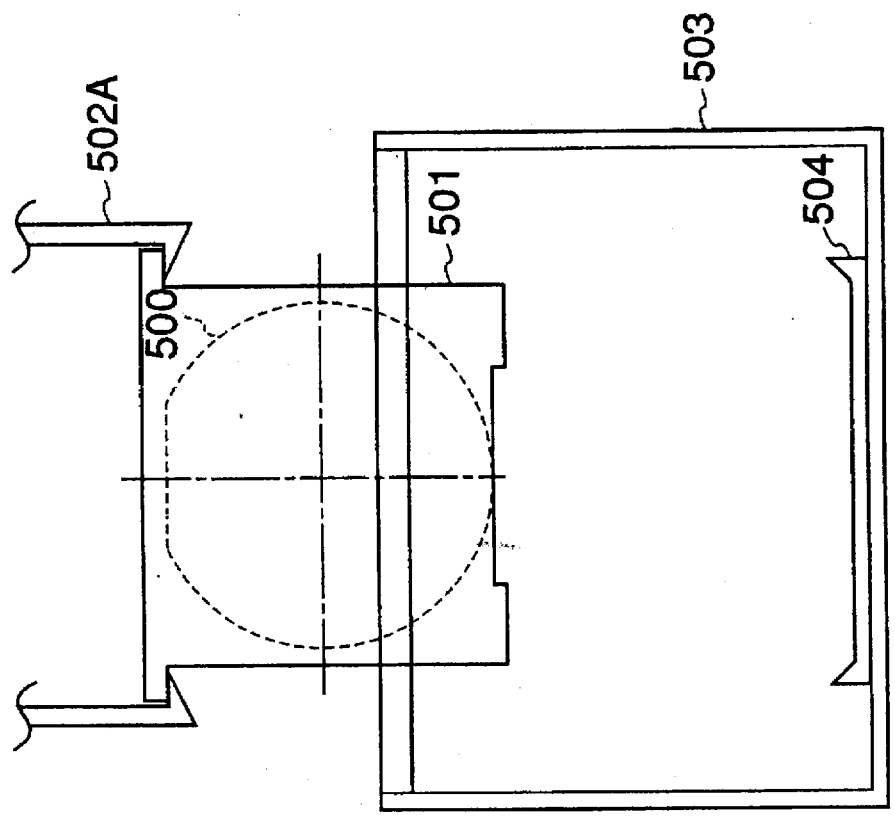
FIGS. 1A and 1B respectively are front views showing a first example of a conventional substrate processing apparatus.
Figure 1B:
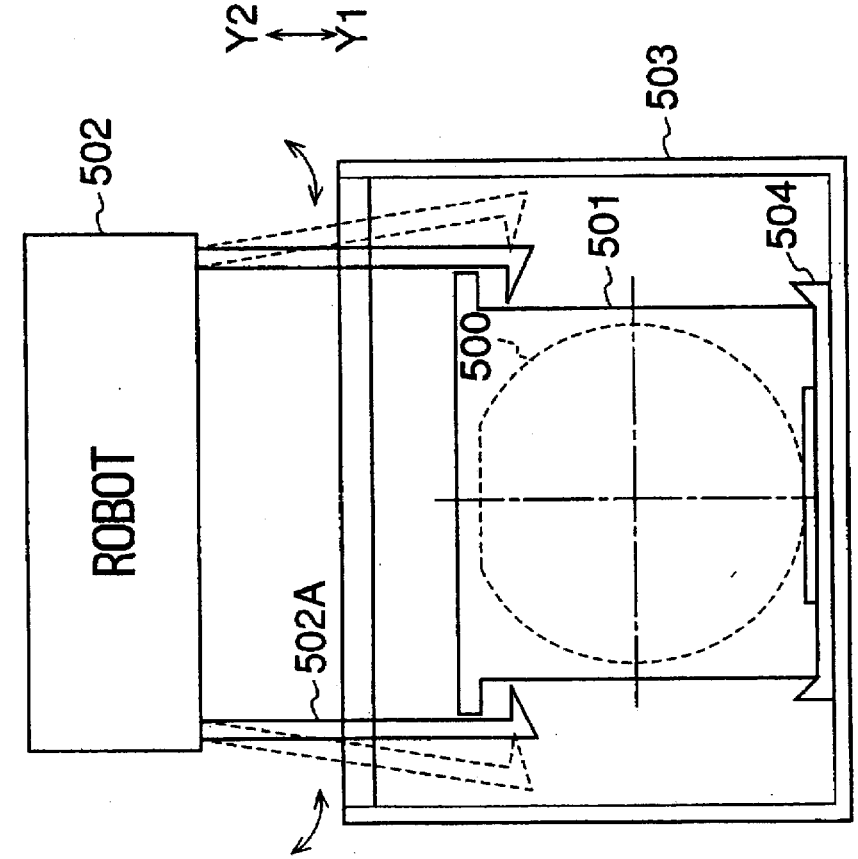
Figure 2B:
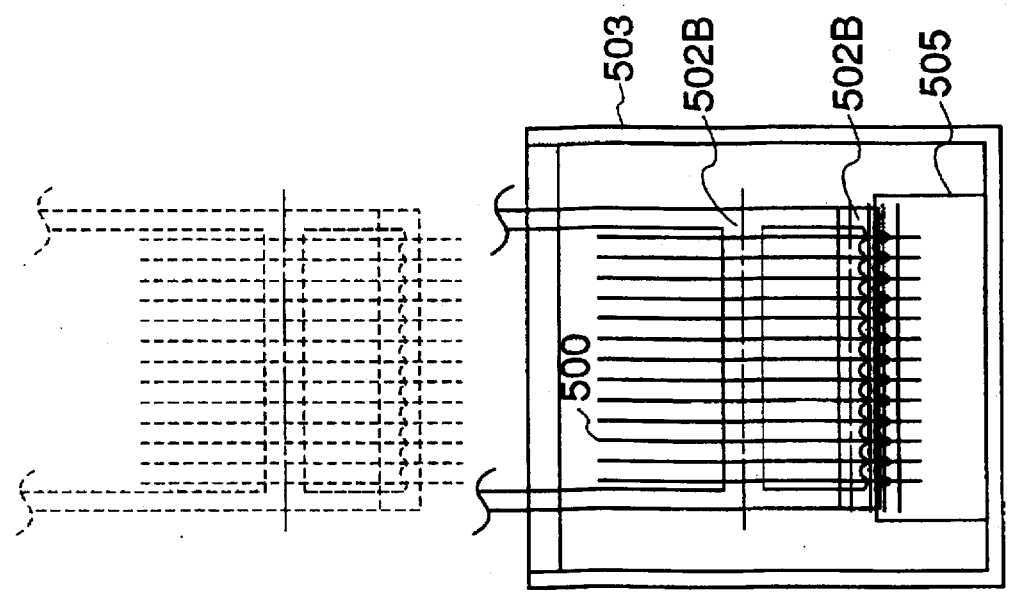
FIGS. 2A and 2B respectively are front views showing a second example of a conventional substrate processing apparatus.
Figure 2A:
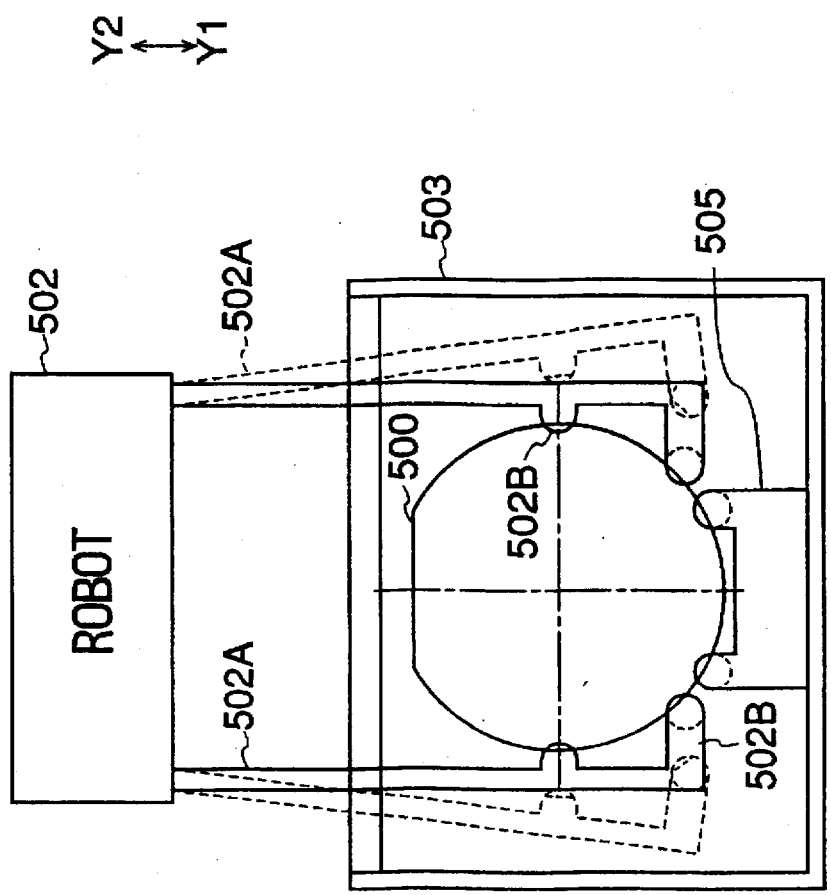
Figure 3A:
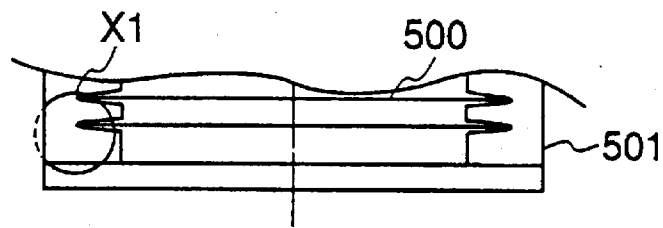
FIGS. 3A and 3B respectively are a partial plan view and a cross sectional view showing a used cleaning carrier.
Figure 3B:
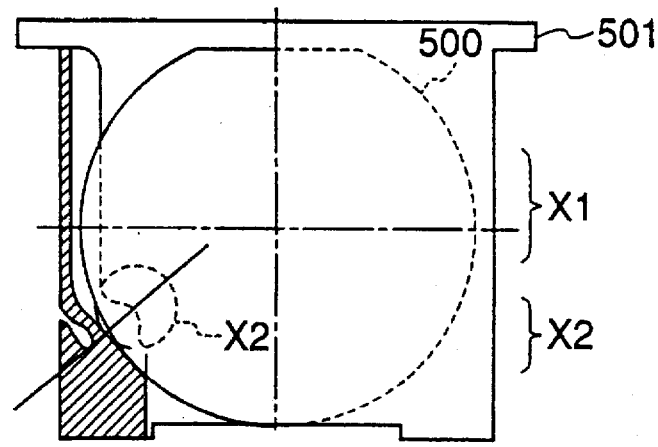
Figure 4A:
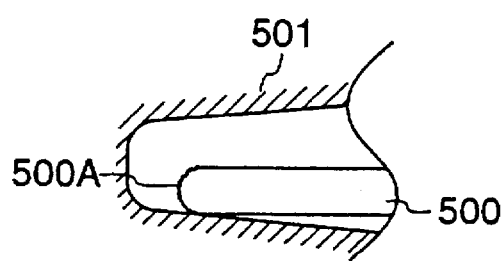
FIGS. 4A and 4B respectively are cross sectional views of parts of the used cleaning carrier shown in FIGS. 3A and 3B for explaining particle generation.
Figure 4B:
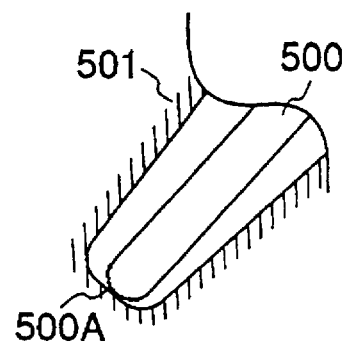
Figure 5A:
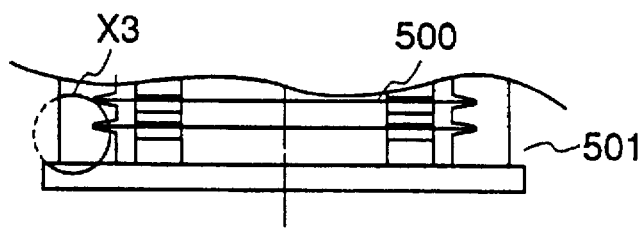
FIGS. 5A and 5B respectively are a partial plan view and a cross sectional view showing another used cleaning carrier.
Figure 5B:
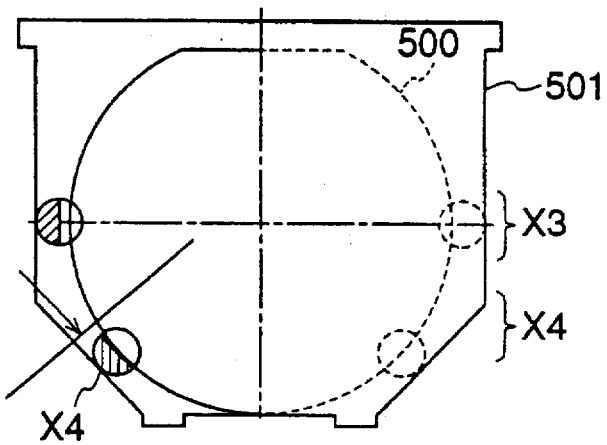
Figure 6A:
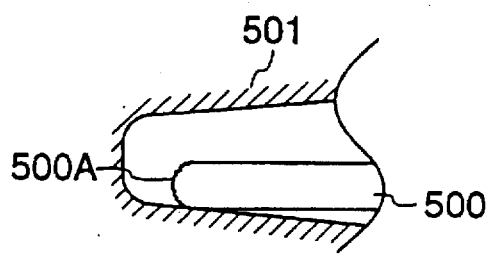
FIGS. 6A and 6B respectively are cross sectional views of parts of the used cleaning carrier shown in FIGS. 5A and 5B for explaining particle generation.
Figure 6B:
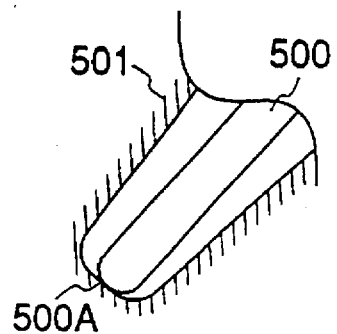

The present inventors conducted experiments using the first conventional substrate processing apparatus shown in FIGS. 5A and 5B and the first embodiment of the substrate processing apparatus shown in FIGS. 7A through 9B. In the experiments, silicon wafers were subjected to a predetermined process on both the first conventional substrate processing apparatus and the first embodiment of the substrate processing apparatus, and the increase in the number of generated particles greater than or equal to 0.2 μm were measured. As a result of the experiments, it was confirmed that in the first embodiment of the substrate processing apparatus the number of generated particles is suppressed to approximately 1/7 that of the first conventional substrate processing apparatus.

Figure 21:
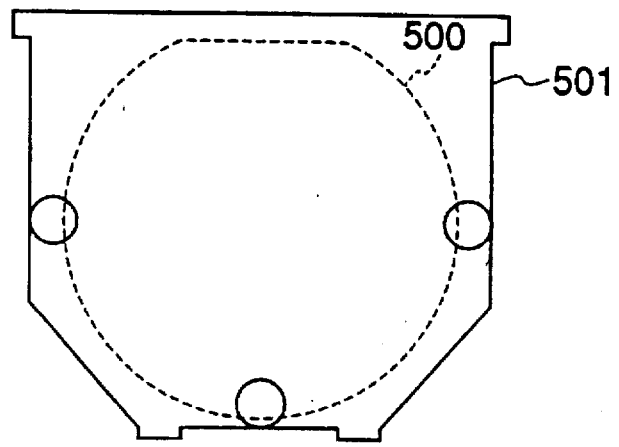
FIG. 21 is a front view showing a modification of a cleaning carrier used in the conventional substrate processing apparatus.

The predetermined process carried out by the experiments included a series of processes including (1) a process using hydrogen peroxide and sulfuric acid, (2) a washing process, (3) a process using hydrogen fluoride (HF, 100:10 80 seconds), (4) a washing process, (5) a process using nitric acid, (6) a washing process, and (7) a drying process. In the first conventional substrate processing apparatus, a modification of the cleaning carrier 501 shown in FIGS. 5A and 5B, that is, a quartz cleaning carrier 501 shown in FIG. 21 was used. The cleaning carrier 501 shown in FIG. 21 supports each wafer 500 at three points as indicated by the circular marks. In other words, each wafer 500 is supported at the right, left and bottom points of the cleaning carrier 501 shown in FIG. 21.

Figure 22A:
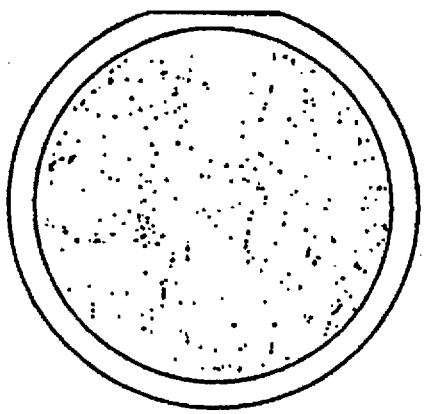
FIGS. 22A and 22B respectively are diagrams showing results of experiments obtained by using the conventional substrate processing apparatus and FIGS. 22C and 22D respectively are diagrams showing results of experiments obtained by using the substrate processing apparatus according to the present invention.

By observing the state of a plurality of wafers that are simultaneously processed, the results shown in FIGS. 22A through 22D were obtained from the experiments. FIG. 22A shows the state of the particles adhered on the wafer 500 that was held at the extreme end slot of the cleaning carrier 501 and subjected to the predetermined process on the first conventional substrate processing apparatus for the second time. The number of particles increased by 675 for this case.

Figure 22B:
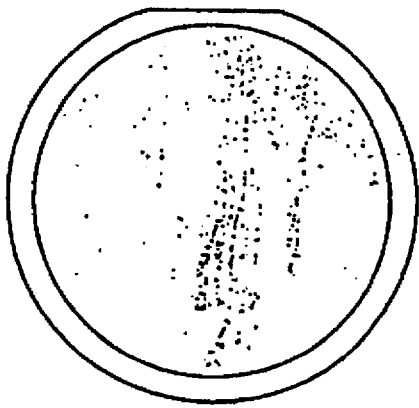

FIG. 22B shows the state of the particles adhered on the wafer 500 that was held at the twelfth slot at an intermediate position of the cleaning carrier 501 and subjected to the predetermined process on the first conventional substrate processing apparatus for the second time. The number of particles increased by 991 for this case.

Figure 22C:
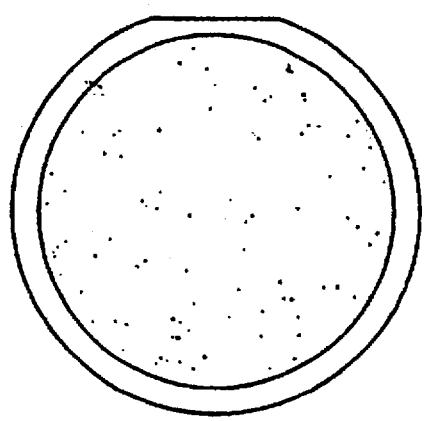

On the other hand, FIG. 22C shows the state of the particles adhered on the wafer 10 that was held at the extreme end slot of the carrier 11 and subjected to the predetermined process on the first embodiment of the substrate processing apparatus for the second time. The number of particles increased by 223 for this case.

Figure 22D:
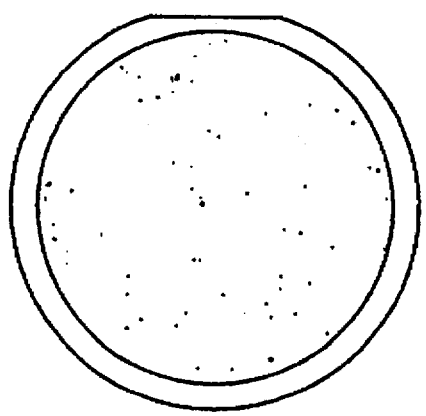

FIG. 22D shows the state of the particles adhered on the wafer 10 that was held at the twelfth slot at an intermediate position of the carrier 11 and subjected to the predetermined process on the first embodiment of the substrate processing apparatus for the second time. The number of particles increased by 142 for this case.

Therefore, it was confirmed through the experiments that the present invention can greatly suppress the increase of the generated particles.

Figure 23:
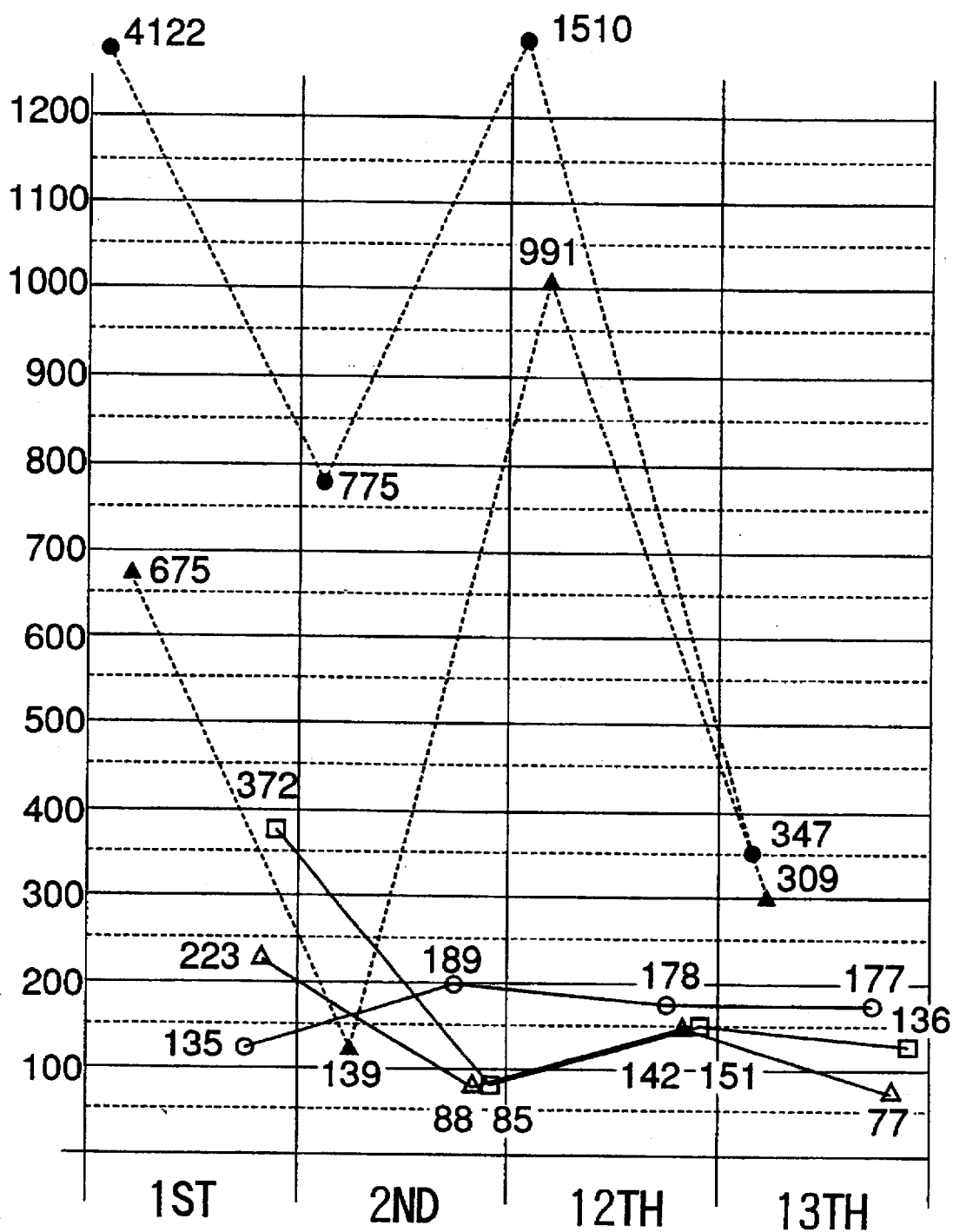
FIG. 23 is a diagram showing the results of the experiments shown in FIGS. 22A through 22D in the form of a graph.

FIG. 23 shows the results of the above experiments in the form of a graph. In FIG. 23, black circular marks indicate the results of the first predetermined process carried out on the first conventional substrate processing apparatus, black triangular marks indicate the results of the second predetermined process carried out on the first conventional substrate processing apparatus, white circular marks indicate the results of the first predetermined process carried out on the first embodiment of the substrate processing apparatus, white triangular marks indicate the results of the second predetermined process carried out on the first embodiment of the substrate processing apparatus, and white rectangular marks indicate the results of the third predetermined process carried out on the first embodiment of the substrate processing apparatus. In addition, the indications "1ST", "2ND", "12TH" and "13TH" in FIG. 23 respectively denote the position of the slot in which the wafer 500 or 10 is accommodated relative to the end of the carrier 501 or 11.

As a result of the experiments, it was found that the increase of the generated particles is 1109 on the average in the case of the first conventional substrate processing apparatus, while the increase of the generated particles is 163 on the average in the case of the first embodiment of the substrate processing apparatus. Therefore, the increase of the generated particles in the first embodiment of the substrate processing apparatus is suppressed to approximately ⅐ that of the first conventional substrate processing apparatus.

Further, the present invention is not limited to these embodiments, but various variations and modifications may be made without departing from the scope of the present invention.

What is claimed is:

1. A substrate processing method comprising the steps of:
   (a) accommodating a plurality of substrates within a carrier, said carrier having a bottom that is open and having a function of stopping inclination of the substrates;
   (b) transporting the substrates and the carrier to a processing chamber by a transport means having a function of supporting weights of the substrates, said transport means being independent of said carrier; and
   (c) carrying out a process on the substrates within the processing chamber.

2. The substrate processing method as claimed in claim 1, wherein said step (b) places the substrates and the carrier on a support that has a function of supporting weights of the substrates and the carrier within the processing chamber after the substrates and the carrier are released by the transport means.

3. The substrate processing method as claimed in claim 1, wherein said step (b) transports the substrates and the carrier in an intentionally inclined state, so that the substrates are transported with surfaces of the substrates slightly deviated from a state parallel to a direction in which gravity acts on the substrates.

4. The substrate processing method as claimed in claim 3, wherein said step (b) places the substrates and the carrier on a support that has a function of supporting weights of the substrates and the carrier within the processing chamber in a state where the substrates and the carrier remain inclined.

5. The substrate processing method as claimed in claim 3, wherein said step (b) transports the substrates and the carrier in the intentionally inclined state, so that the substrates are transported with the surfaces of the substrates deviated by 2° to 3° from the state parallel to the direction in which gravity acts on the substrates.

6. The substrate processing method as claimed in claim 1, wherein said step (b) transports the substrates and the carrier by supporting the substrates at positions different from positions where the carrier is supported.

7. The substrate processing method as claimed in claim 1, wherein said step (b) transports the substrates and the carrier by simultaneously supporting the substrates and the carrier at the same positions.

8. A substrate processing apparatus comprising:
   transport means for transporting a plurality of substrates and a carrier, that accommodates the substrates, by supporting weights of the substrates, said carrier having a bottom that is open and having a function of stopping inclination of the substrates, said transport means being independent of said carrier; and
   processing chamber supporting the substrates and the carrier transported by said transport means and subjecting the substrates to a process.

9. The substrate processing apparatus as claimed in claim 8, wherein said processing chamber has a support on which the substrates and the carrier are placed within said processing chamber, said support having a function of supporting weights of the substrates and the carrier within said processing chamber after the substrates and the carrier are released by the transport means.

10. The substrate processing apparatus as claimed in claim 8, wherein said transport means transports the substrates and the carrier in an intentionally inclined state, so that the substrates are transported with surfaces of the substrates slightly deviated from a state parallel to a direction in which gravity acts on the substrates.

11. The substrate processing apparatus as claimed in claim 10, wherein said processing chamber has a support on which the substrates and the carrier are placed within said processing chamber, said support having a function of supporting weights of the substrates and the carrier within the processing chamber in a state where the substrates and the carrier remain inclined.

12. The substrate processing apparatus as claimed in claim 10, wherein said transport means transports the substrates and the carrier in the intentionally inclined state, so that the substrates are transported with the surfaces of the substrates deviated by 2° to 3° from the state parallel to the direction in which gravity acts on the substrates.

13. The substrate processing apparatus as claimed in claim 8, wherein said transport means transports the substrates and the carrier by supporting the substrates at positions different from positions where the carrier is supported.

14. The substrate processing apparatus as claimed in claim 8, wherein said transport means transports the substrates and the carrier by simultaneously supporting the substrates and the carrier at the same positions.

15. The substrate processing apparatus as claimed in claim 8, wherein said carrier has depressions provided thereon, and said transport means transports the substrates and the carrier by simultaneously supporting the substrate and the carrier at the same positions via said depressions.

16. A substrate processing apparatus comprising:
   transport means for transporting a plurality of substrates and a carrier, that accommodates the substrates, by supporting weights of the substrates, said carrier having a bottom that is open and having a function of stopping inclination of the substrates; and
   processing chamber supporting the substrates and the carrier transported by said transport means and subjecting the substrates to a process,
   said transport means including a sawtooth shaped portion having undulations with a pitch that is smaller than a pitch of the substrates accommodated within the carrier,
   said sawtooth shaped portion being provided at each part of said transport means supporting the weights of the substrates after the substrates and the carrier are released by the transport means.

17. A substrate processing apparatus comprising:

transport means for transporting a plurality of substrates and a carrier, that accommodates the substrates, by supporting weights of the substrates, said carrier having a bottom that is open and having a function of stopping inclination of the substrates; and processing chamber supporting the substrates and the carrier transported by said transport means and subjecting the substrates to a process, said processing chamber having a support on which the substrates and the carrier are placed within said processing chamber, said support having a function of supporting wights of the substrates and the carrier within said processing chamber after the substrates and the carrier are released by said transport means, said support including a sawtooth shaped portion having undulations with a pitch that is smaller than a pitch of the substrates accommodated within the carrier, said sawtooth shaped portion being provided at each part of said support supporting the weights of the substrates within said processing chamber after the substrates and the carrier are released by the transport means.

18. The substrate processing method as claimed in claim 1, wherein said step (b) transports the substrates and the carrier by simultaneously supporting the substrates and the carrier at the same positions via depressions provided on the carrier.

19. A method of transporting substrates comprising the steps of:

(a) accommodating a plurality of substrates within a carrier, said carrier having a bottom that is open and having a function of stopping inclination of the substrates; and (b) transporting the substrates and the carrier by a transport means having a function of supporting weights of the substrates, said transport means being independent of the carrier.

20. The method of transporting substrates as claimed in claim 19, wherein said step (b) transports the substrates and the carrier by simultaneously supporting the substrates and the carrier at the same positions via depressions provided on the carrier.

* * * * *